(12) United States Patent
Kim et al.

(10) Patent No.: US 10,095,823 B2
(45) Date of Patent: Oct. 9, 2018

(54) ELECTRONIC DEVICE AND METHOD FOR FABRICATING THE SAME

(71) Applicant: SK hynix Inc., Icheon (KR)

(72) Inventors: Chi-Soung Kim, Icheon (KR); Ki-Taek Kang, Cheongju (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 15/686,644

(22) Filed: Aug. 25, 2017

(65) Prior Publication Data

US 2018/0181695 A1    Jun. 28, 2018

(30) Foreign Application Priority Data

Dec. 22, 2016   (KR) .................. 10-2016-0176516

(51) Int. Cl.
| | |
|---|---|
| *G11C 7/22* | (2006.01) |
| *G06F 17/50* | (2006.01) |
| *H01L 27/11565* | (2017.01) |
| *H01L 27/11573* | (2017.01) |
| *H01L 27/11582* | (2017.01) |

(52) U.S. Cl.
CPC ...... *G06F 17/5068* (2013.01); *G06F 17/5072* (2013.01); *H01L 27/11565* (2013.01); *H01L 27/11573* (2013.01); *H01L 27/11582* (2013.01); *G06F 17/5077* (2013.01)

(58) Field of Classification Search
CPC . G11C 2213/71; G11C 13/0002; G11C 5/025; G11C 13/0023; G11C 13/0026; G11C 13/0028; G11C 13/003; G11C 16/10; G11C 5/06; G11C 13/0004; G11C 13/0007; G11C 16/0483
USPC ......... 365/51, 185.18, 63, 71; 438/122, 128, 438/16, 198, 268, 269, 381, 382, 586, 438/694, 702
See application file for complete search history.

(56) References Cited

U.S. PATENT DOCUMENTS

2015/0035065 A1\* 2/2015 Park ..................... H01L 27/105
257/368

FOREIGN PATENT DOCUMENTS

KR    10-2016-0016430 A    2/2016

\* cited by examiner

*Primary Examiner* — Thong Q Le

(57) ABSTRACT

An electronic device includes a semiconductor memory. The semiconductor memory includes first and second lower plugs, a first pad, a second pad, a first lower line, a second lower line, a first insulation pattern, a second insulation pattern, an upper plug, an upper line, and a plurality of variable resistance elements disposed at regions where the first and second lower lines overlap the upper line.

17 Claims, 16 Drawing Sheets

ELECTRONIC DEVICE AND METHOD FOR FABRICATING THE SAME

CROSS-REFERENCE TO RELATED APPLICATION

This patent document claims priority to Korean Patent Application No. 10-2016-0176516, entitled "ELECTRONIC DEVICE AND METHOD OF FORMING THE SAME" and filed on Dec. 22, 2016, which is incorporated herein by reference in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for electronic devices capable of storing information in various electronic devices or appliances such as a computer, a portable communication device, and so on, and research and development for such electronic devices have been conducted. Examples of such electronic devices include electronic devices which can store data by switching between different resistant states according to an applied voltage or current, and can be implemented in various configurations, for example, in an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device and a method for fabricating the same, in which an electronic device includes a semiconductor memory, which can improve characteristics of a variable resistance element.

In one aspect, an electronic device may include a semiconductor memory, and the semiconductor memory may include first and second lower plugs disposed over a substrate; a first pad disposed over the first lower plug; a second pad being spaced apart from the first pad in the first direction; a first lower line extending from the first pad, being disposed between the first pad and the second pad in the first direction, and having a smaller width than the first pad in a second direction crossing the first direction; a second lower line extending from the second pad, being disposed between the first pad and the second pad in the first direction, being spaced apart from the first lower line in the second direction, and having a smaller width than the second pad in the second direction; a first insulation pattern disposed between the first lower line and the second pad, the first insulation pattern being in contact with an end of the first lower line; a second insulation pattern disposed between the second lower line and the first pad, the second insulation pattern being in contact with an end of the second lower line; an upper plug disposed over the second lower plug; an upper line traversing first lower line and the second lower line, being coupled to the upper plug, and extending in the second direction; and a plurality of variable resistance elements disposed at regions where the first and second lower lines overlap the upper line.

Implementations of the above electronic device may include one or more the following.

A lower end of the first insulation pattern, a lower end of the second insulation pattern, and a lower end of the upper plug may be aligned on substantially the same plane as one another. A lower end of the first insulation pattern, a lower end of the second insulation pattern, and a lower end of the upper plug may be disposed below a lower surface of the first lower line, a lower surface of the first pad, and a lower surface of the second pad. The first insulation pattern, the second insulation pattern, and the upper plug may have substantially the same height as one another. An upper end of the first insulation pattern, an upper end of the second insulation pattern, an upper end of the upper plug, and upper surfaces of the plurality of variable resistance elements may be aligned on substantially the same plane as one another. An upper end of the first insulation pattern and an upper end of the second insulation pattern may be disposed below an upper end of the upper plug. An upper end of the first lower plug and an upper end of the second lower plug may be aligned on substantially the same plane as each other. In the second direction, the first lower line may have a first width, the first pad may have a second width, the second width being smaller than two times the first width. The electronic device may further include a third pad adjacent to the second pad; and a third lower line extending from the third pad and being adjacent to the second lower line in the second direction, wherein the third pad may be spaced apart from the second pad by a third width in the second direction, the third width being greater than the first width and smaller than three times the first width. The electronic device may further include a first projection part, which extends from the first pad, is disposed between the first pad and the second insulation pattern, and has substantially the same width as the second lower line in the second direction; and a second projection part, which extends from the second pad, is disposed between the second pad and the first insulation pattern, and has substantially the same width as the first lower line in the second direction, wherein the first and second project parts may be parallel to the first and second lower lines. A side surface of the first lower line, a side surface of the second projection part, and a side surface of the second pad may be aligned on substantially the same plane as one another along the first direction. A first side surface of the first lower line, a first side surface of the second projection part, and a first side surface of the second pad may be aligned on substantially the same plane as one another along the first direction, wherein a second side surface of the first lower line, a second side surface of the second projection part, and a first side surface of the first pad may be aligned on substantially the same plane as one another along the first direction, wherein a first side surface of the second lower line, a first side surface of the first projection part, and a second side surface of the second pad may be aligned on substantially the same plane as one another along the first direction, and wherein a second side surface of the second lower line, a second side surface of the first projection part, and a second side surface of the first pad may be aligned on substantially the same plane as one another along the first direction.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted from an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted from an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In another aspect, a method for fabricating an electronic device including a semiconductor memory may include: forming first and second lower plugs over a substrate; forming a lower line pattern over the first lower plugs, the lower line pattern including a plurality of pads and a plurality of lower lines, each of the plurality of lower lines extending in a first direction and connecting two pads of the plurality of pads that are spaced apart from each other in the first direction; forming an interlayer dielectric layer over the second lower plugs and the lower line layer; forming a plurality of trenches passing through the interlayer dielectric layer and the plurality of lower lines, and simultaneously forming a plurality of contact holes passing through the interlayer dielectric layer and exposing the second lower plugs; forming a plurality of insulation patterns in the plurality of trenches; forming a plurality of upper plugs in the plurality of contact holes; and forming a plurality of upper lines traversing the plurality of lower lines and coupled to the plurality of upper plugs, the plurality of upper lines extending in a second direction crossing the first direction, wherein the method may further include forming a plurality of variable resistance elements at regions where the plurality of lower lines overlap the plurality of upper lines, and wherein each of the plurality of lower lines may extend from a corresponding one of the plurality of pads.

Implementations of the above method for fabricating the electronic device may include one or more the following.

Lower ends of the plurality of insulation patterns and lower ends of the plurality of upper plugs may be aligned on substantially the same plane as one another. Lower ends of the plurality of insulation patterns and lower ends of the plurality of upper plugs may be disposed below lower surfaces of the plurality of lower lines and lower surfaces of the plurality of pads. The plurality of insulation patterns may have substantially the same height as those of the plurality of upper plugs. Upper ends of the plurality of insulation patterns may be formed below upper ends of the plurality of upper plugs. Upper ends of the first and second lower plugs may be aligned on substantially the same plane as each other. The plurality of pads may include a first pad and a second pad spaced apart from the first pad in the first direction, wherein the plurality of lower lines may include a first lower line and a second lower line spaced apart from the first lower line in the second direction, wherein the plurality of insulation patterns may include a first insulation pattern and a second insulation pattern, wherein the first lower line may extend from the first pad, has a smaller width than the first pad in the second direction, and may be formed between the first pad and the second pad in the first direction, wherein the second lower line may extend from the second pad, may be spaced apart from the first lower line in the second direction, and may be formed between the first pad and the second pad in the first direction, and wherein the first insulation pattern may be formed between the first lower line and the second pad and is in contact with an end of the first lower line, and the second insulation pattern may be formed between the second lower line and the first pad and may be in contact with an end of the second lower line. In the second direction, the first lower line may have a first width, the first pad has a second width, the second width being smaller than two times the first width. The method may further include forming a third pad that is adjacent to the second pad; and forming a third lower line that extends from the third pad and is spaced apart from the second lower line in the second direction, wherein the third pad may be spaced apart from the second pad by a third width in the second direction, the third width being greater than the first width and smaller than three times the first width. The method may further include forming a first projection part that extends from the first pad, is formed between the first pad and the second insulation pattern, and has substantially the same width as the second lower line in the second direction; and forming a second projection part that extends from the second pad, is formed between the second pad and the first insulation pattern, and has substantially the same width as the first lower line in the second direction, wherein the first and second project parts may be parallel to the first and second lower lines.

These and other aspects, implementations and associated advantages are described in greater detail in the drawings, the description and the claims.

DETAILED DESCRIPTION

Figure 1:
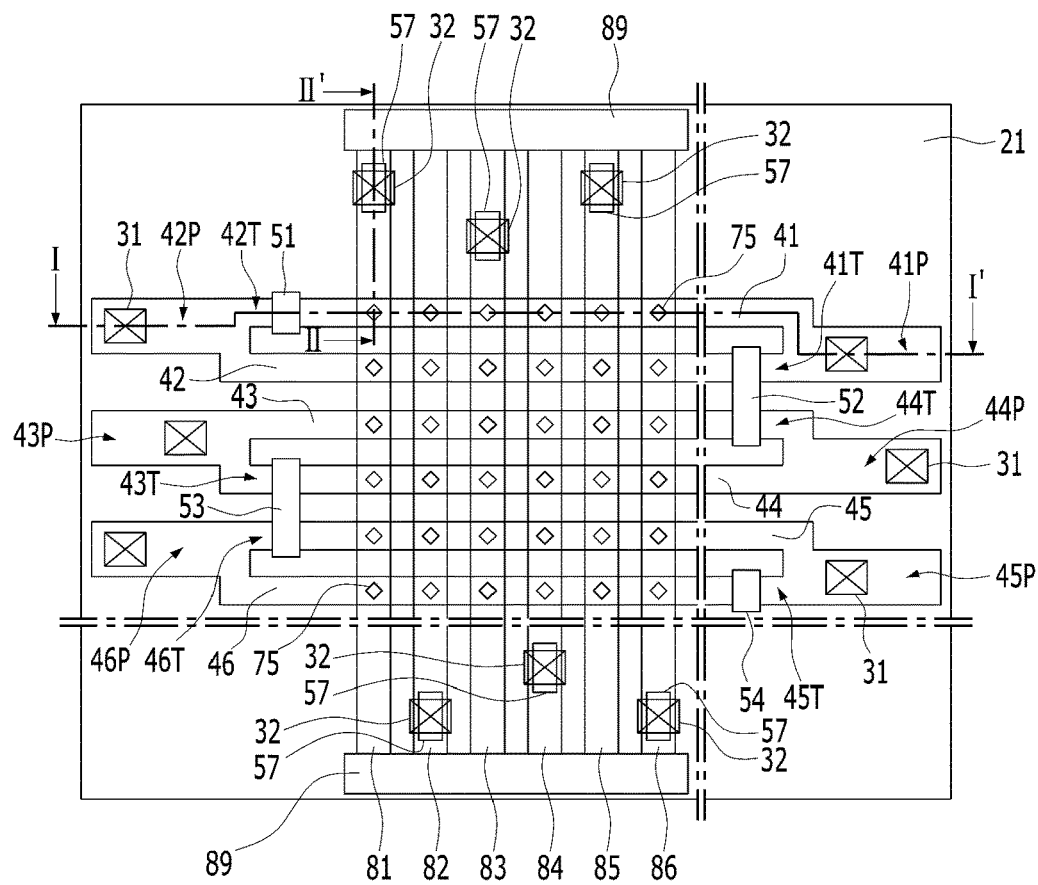
FIG. 1 is a layout view illustrating a semiconductor device including variable resistance elements and related elements in accordance with an implementation of the present disclosure.

Various examples and implementations of the disclosed technology are described below in detail with reference to the accompanying drawings.

The drawings may not be necessarily to scale and in some instances, proportions of at least some of substrates in the drawings may have been exaggerated in order to clearly illustrate certain features of the described examples or implementations.

In presenting a specific example in a drawing or description having two or more layers in a multi-layer substrate, the relative positioning relationship of such layers or the sequence of arranging the layers as presented reflects a particular implementation for the described or illustrated example. However, implementations may include a different relative positioning relationship or sequence of arranging the layers. In addition, a described or illustrated example of a multi-layer structure may not reflect all layers present in that particular multilayer structure. For example, one or more additional layers may be present between two illustrated layers. In a specific example, when a first layer in a described or illustrated multi-layer substrate is referred to as being "on" or "over" a second layer or "on" or "over" a substrate, the first layer may be directly disposed on the second layer or the substrate, or may be separated from the second layer or the substrate by one or more other intermediate layers.

An electronic device in accordance with implementations of the present disclosure may include a semiconductor memory or a semiconductor device including a variable resistance element. The variable resistance element may include a variable resistance layer and lines coupled to the variable resistance layer. In some implementations, the semiconductor memory or the semiconductor device may include an RRAM (Resistive Random Access Memory). When variable resistance elements are highly integrated, the alignment clearance of lines is relatively small, and thus a bridge failure may occur between contact plugs and adjacent lines. Therefore, the development of technology capable of improving processes of fabricating a variable resistance element is required.

Figure 2:
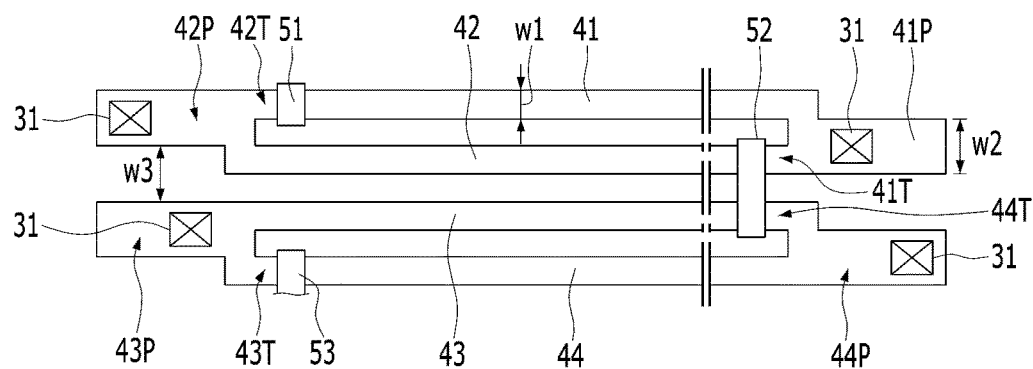
FIG. 2 is a layout view illustrating a part of the semiconductor device of FIG. 1.
Figure 3:
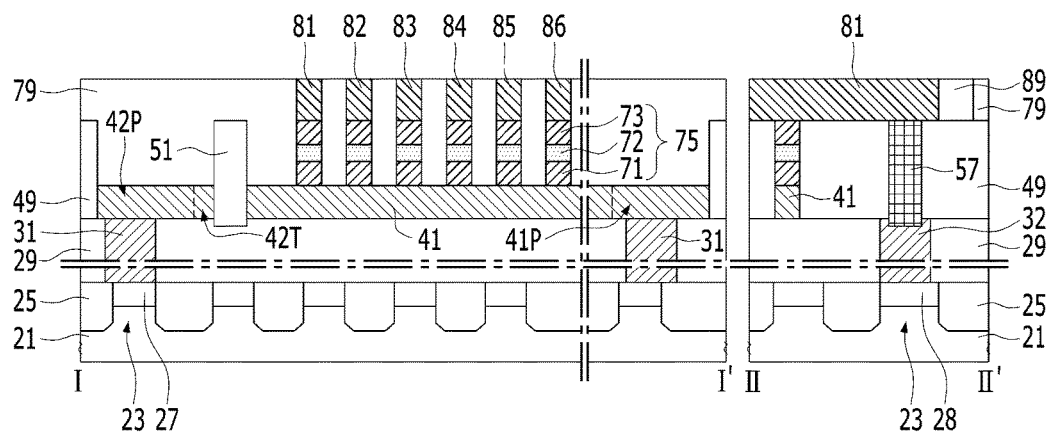
FIGS. 3 and 4 are cross-sectional views taken along lines I-I' and II-II' of FIG. 1 in accordance with implementations of the present disclosure.
Figure 4:
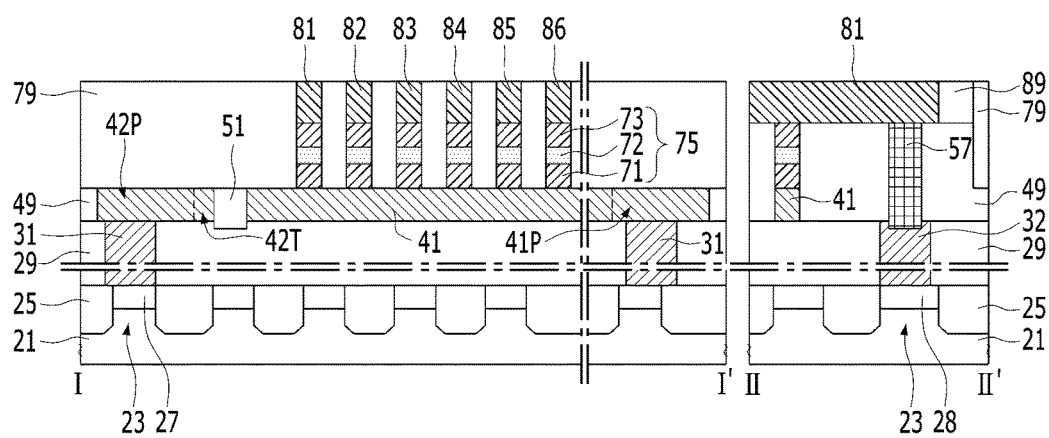

FIG. 1 is a layout view illustrating a semiconductor device including variable resistance elements and related elements in accordance with an implementation of the present disclosure. FIG. 2 is a layout view illustrating a part of the semiconductor device of FIG. 1. FIGS. 3 and 4 are cross-sectional views taken along lines I-I' and II-II' of FIG. 1 in accordance with implementations of the present disclosure.

The semiconductor device in accordance with the implementation of the present disclosure may include a non-volatile memory cell array including variable resistance elements and elements formed in a peripheral area surrounding the variable resistance elements.

Referring to FIGS. 1 to 3, active regions 23, a device isolation layer 25, a plurality of switching elements 27 and 28, a first interlayer dielectric layer 29, a plurality of lower plugs 31 and 32, a plurality of lower lines 41, 42, 43, 44, 45, and 46, a plurality of pads 41P, 42P, 43P, 44P, 45P, and 46P, a plurality of projection parts 41T, 42T, 43T, 44T, 45T, and 46T, a second interlayer dielectric layer 49, a plurality of insulation patterns 51, 52, 53, and 54, a plurality of upper plugs 57, a plurality of variable resistance elements 75, a third interlayer dielectric layer 79, a plurality of upper insulation patterns 89, and a plurality of upper lines 81, 82, 83, 84, 85, and 86 may be formed over a substrate 21.

The plurality of switching elements 27 and 28 may include first switching elements 27 and second switching elements 28. The second switching elements 28 may be formed in a region spaced apart from the first switching elements 27. The plurality of switching elements 27 and 28 may be disposed in the peripheral area surrounding the plurality of variable resistance elements 75.

The plurality of lower plugs 31 and 32 may include first lower plugs 31, which are formed over the first switching elements 27, and second lower plugs 32, which are formed over the second switching elements 28. Each of the first lower plugs 31 may correspond to a word plug or a word line contact plug. Each of the first lower plugs 31 may be electrically coupled to a corresponding one of the first switching elements 27. Each of the second lower plugs 32 may be electrically coupled to a corresponding one of the second switching elements 28. The first lower plugs 31 and the second lower plugs 32 may pass through the first interlayer dielectric layer 29. Upper surfaces of the first lower plugs 31, upper surfaces of the second lower plugs 32, and an upper surface of the first interlayer dielectric layer 29 may be aligned on substantially the same plane as one another.

The plurality of lower lines 41, 42, 43, 44, 45, and 46 may include a first lower line 41, a second lower line 42, a third lower line 43, a fourth lower line 44, a fifth lower line 45, and a sixth lower line 46. The plurality of lower lines 41, 42, 43, 44, 45, and 46 may correspond to word lines. The plurality of pads 41P, 42P, 43P, 44P, 45P, and 46P may include a first pad 41P, a second pad 42P, a third pad 43P, a fourth pad 44P, a fifth pad 45P, and a sixth pad 46P. The plurality of projection parts 41T, 42T, 43T, 44T, 45T, and 46T may include a first projection part 41T, a second projection part 42T, a third projection part 43T, a fourth projection part 44T, a fifth projection part 45T, and a sixth projection part 46T.

The plurality of lower lines 41, 42, 43, 44, 45, and 46 may extend in a first direction parallel to the line I-I', and may be spaced apart from one another in a second direction. The second direction crosses the first direction and is parallel to the line II-II'. Each the plurality of pads 41P, 42P, 43P, 44P, 45P, and 46P may be in continuity with a corresponding one of the plurality of lower lines 41, 42, 43, 44, 45, and 46. Each of the plurality of projection parts 41T, 42T, 43T, 44T, 45T, and 46T may be in continuity with a corresponding one of the plurality of pads 41P, 42P, 43P, 44P, 45P, and 46P. Each of the plurality of pads 41P, 42P, 43P, 44P, 45P, and 46P may be in direct contact with a corresponding one of the first lower plugs 31.

The plurality of insulation patterns 51, 52, 53, and 54 may include a first insulation pattern 51, a second insulation pattern 52, a third insulation pattern 53, and a fourth insulation pattern 54. The plurality of insulation patterns 51, 52, 53, and 54 may be in direct contact with ends of the plurality of lower lines 41, 42, 43, 44, 45, and 46 and ends of the plurality of projection parts 41T, 42T, 43T, 44T, 45T, and 46T. The plurality of insulation patterns 51, 52, 53, and 54 may pass through the plurality of lower lines 41, 42, 43, 44, 45, and 46. Lower ends of the plurality of insulation patterns 51, 52, 53, and 54 may be formed below bottom surfaces of the plurality of lower lines 41, 42, 43, 44, 45, and 46. Lower ends of the plurality of insulation patterns 51, 52, 53, and 54 may be formed below the upper surfaces of the first interlayer dielectric layer 29. Upper ends of the plurality of insulation patterns 51, 52, 53, and 54 may be formed above upper surfaces of the plurality of lower lines 41, 42, 43, 44, 45, and 46.

The plurality of upper plugs 57 may be in direct contact with the second lower plugs 32. The upper plugs 57 and the second lower plugs 32 may correspond to bit plugs or bit line contact plugs. The plurality of upper plugs 57 may pass through the second interlayer dielectric layer 49. Lower ends of the plurality of upper plugs 57 may be formed below upper surfaces of the second lower plugs 32. The lower ends of the plurality of upper plugs 57 may be formed below the upper surface of the first interlayer dielectric layer 29.

The lower ends of the plurality of upper plugs 57 may be aligned on substantially the same plane as the lower ends of the plurality of insulation patterns 51, 52, 53, and 54. The plurality of upper plugs 57 may have substantially the same height as the plurality of insulation patterns 51, 52, 53, and 54. Upper ends of the plurality of upper plugs 57, the upper ends of the plurality of insulation patterns 51, 52, 53, and 54, and upper ends of the plurality of variable resistance elements 75 may be aligned on substantially the same plane as one another.

The plurality of upper lines 81, 82, 83, 84, 85, and 86 may include a first upper line 81, a second upper line 82, a third upper line 83, a fourth upper line 84, a fifth upper line 85, and a sixth upper line 86. The plurality of upper lines 81, 82, 83, 84, 85, and 86 may correspond to bit lines. The plurality of upper lines 81, 82, 83, 84, 85, and 86 may extend in the second direction, and may be arranged parallel to one another in the first direction. The plurality of upper lines 81, 82, 83, 84, 85, and 86 may be formed over the plurality of upper plugs 57. Each of the plurality of upper lines 81, 82, 83, 84, 85, and 86 may be in direct contact with a corresponding one of the plurality of upper plugs 57. The plurality of upper insulation patterns 89 may be in direct contact with both ends of the plurality of upper lines 81, 82, 83, 84, 85, and 86.

The plurality of upper lines 81, 82, 83, 84, 85, and 86 may traverse the plurality of lower lines 41, 42, 43, 44, 45, and 46. The variable resistance elements 75 may be formed at intersection regions between the plurality of upper lines 81, 82, 83, 84, 85, and 86 and the plurality of lower lines 41, 42, 43, 44, 45, and 46. That is, the variable resistance elements 75 may be disposed between the plurality of upper lines 81, 82, 83, 84, 85, and 86 and the plurality of lower lines 41, 42, 43, 44, 45, and 46 where the plurality of upper lines 81, 82, 83, 84, 85, and 86 and the plurality of lower lines 41, 42, 43, 44, 45, and 46 overlap. The variable resistance elements 75 may be formed between the plurality of upper lines 81, 82, 83, 84, 85, and 86 and the plurality of lower lines 41, 42, 43, 44, 45, and 46 in a third direction perpendicular to the first and second directions. Each of the variable resistance elements 75 may include a lower electrode 71, a variable resistance pattern 72, and an upper electrode 73.

The lower electrode 71 may include a conductive material such as a metal, a metal nitride, a metal oxide, a metal silicide, conductive carbon, or a combination thereof. The lower electrode 71 may be in direct contact with a corresponding one of the lower lines 41, 42, 43, 44, 45, and 46.

The variable resistance pattern 72 may be formed between the lower electrode 71 and the upper electrode 73 in the third direction. The variable resistance pattern 72 may have a variable resistance characteristic. That is, the variable resistance pattern 72 may switch between different resistance states according to a voltage or current applied to the lower electrode 71 and the upper electrode 73. The variable resistance pattern 72 may include one or more of various materials, which are used in RRAM, PRAM, FRAM, MRAM, etc. The variable resistance pattern 72 may include a transition metal oxide, a metal oxide such as a perovskite material, a phase change material such as a chalcogenide material, a ferroelectric material, a ferromagnetic material, or a combination thereof. The variable resistance pattern 72 may have a single-layer structure or a multi-layer structure.

The upper electrode 73 may include a conductive material such as a metal, a metal nitride, a metal oxide, a metal silicide, conductive carbon, or a combination thereof. The upper electrode 73 may be in direct contact with a corresponding one of the plurality of upper lines 81, 82, 83, 84, 85, and 86.

In some implementations, a selecting element may be formed between the variable resistance pattern 72 and the lower electrode 71, or between the variable resistance pattern 72 and the upper electrode 73, or both. Although the description of the selecting element is omitted herein for the purpose of brevity, one having ordinary skill in the art would recognize that the selecting element could be any of a variety of different structures. The variable resistance pattern 72 may correspond to a storage layer. The lower electrode 71, the variable resistance pattern 72, and the upper electrode 73 may correspond to a non-volatile memory cell.

Referring to FIG. 2, the second pad 42P may face the first pad 41P in the first direction. The first lower line 41 may be in continuity with one side of the first pad 41P, and formed between the first pad 41P and the second pad 42P in the first direction. The second lower line 42 may be in continuity with one side of the second pad 42P, and formed between the first pad 41P and the second pad 42P in the first direction. The first and second lower lines 41 and 42 may be arranged parallel to each other in the second direction.

The third pad 43P may be disposed adjacent to the second pad 42P in the second direction, and may face the fourth pad 44P in the first direction. The fourth pad 44P may be disposed adjacent to the first pad 41P in the second direction. The third lower line 43 may be in continuity with one side of the third pad 43P, formed between the third pad 43P and the fourth pad 44P, disposed adjacent to the second lower line 42, and arranged parallel to the second lower line 42 in the second direction. The fourth lower line 44 may be in continuity with the fourth pad 44P, formed between the third pad 43P and the fourth pad 44P, disposed adjacent to the third lower line 43, and arranged parallel to the third lower line 43 in the second direction.

The first projection part 41T may be in continuity with one side of the first pad 41P, and formed between the first pad 41P and the second lower line 42. The second projection part 42T may be in continuity with one side of the second pad 42P, and formed between the second pad 42P and the first lower line 41. The third projection part 43T may be continuity with one side of the third pad 43P, and formed between the third pad 43P and the fourth lower line 44. The fourth projection part 44T may be continuity with one side of the fourth pad 44P, and formed between the fourth pad 44P and the third lower line 43.

A first side surface of the first lower line 41, a first side surface of the second projection part 42T, and a first side surface of the second pad 42P may be aligned on substantially the same plane as one another along the first direction. A second side surface of the second lower line 42, a second side surface of the first projection part 41T, and a second side surface of the first pad 41P may be aligned on substantially the same plane as one another along the first direction. A first side surface of the third lower line 43, a first side surface of the fourth projection part 44T, and a first side surface of the third pad 43P may be aligned on substantially the same plane as one another along the first direction. A second side surface of the fourth lower line 44, a second side surface of the third projection part 43T, and a second side surface of the fourth pad 44P may be aligned on substantially the same plane as one another along the first direction.

In addition, a second side surface of the first lower line 41, a second side surface of the second projection part 42T, and a first side surface of the first pad 41P may be aligned on substantially the same plane as one another along the first direction. A first side surface of the second lower line 42, a first side surface of the first projection part 41T, and a second side surface of the second pad 42P may be aligned on substantially the same plane as one another along the first direction. A second side surface of the third lower line 43, a second side surface of the fourth projection part 44T, and a first side surface of the fourth pad 44P may be aligned on substantially the same plane as one another along the first direction. A first side surface of the fourth lower line 44, a first side surface of the third projection part 43T, and a second side surface of the third pad 43P may be aligned on substantially the same plane as one another along the first direction. The first side surface of each of the above described elements faces the second side surface in the second direction.

The first insulation pattern 51 may traverse a space between the first lower line 41 and the second projection part 42T so that the first lower line 41 and the second projection part 42T are separate from each other. A first width of the first lower line 41 and a first width of the second projection part 42T in the second direction may be substantially the same as each other. The first lower line 41 and the second projection part 42T may be in direct contact with two side surfaces of the first insulation pattern 51, respectively, in the first direction.

The second insulation pattern 52 may traverse a space between the second lower line 42 and the first projection part 41T, and a space between the third lower line 43 and the fourth projection part 44T. First widths of the second lower line 42 and the first projection part 41T in the second direction may be substantially the same as each other. A first width of the third lower line 43 and a first width of the fourth projection part 44T in the second direction may be substantially the same as each other. The second lower line 42 and the third lower line 43 may be in direct contact with a first side surface of the second insulation pattern 52, and the first projection part 41T and the fourth projection part 44T may be in direct contact with a second side surface of the second insulation pattern 52. The first and second side surfaces of the second insulation pattern 52 face each other in the first direction.

The third insulation pattern 53 may traverse a space between the fourth lower line 44 and the third projection part 43T. A first width of the fourth lower line 44 and a first width of the third projection part 43T in the second direction may be substantially the same as each other. The fourth lower line 44 and the third projection part 43T may be in direct contact with two side surfaces of the third insulation pattern 53, respectively, in the first direction.

Each of the lower lines 41, 42, 43, 44, 45, and 46 may have a first width W1, and each of the pads 41P, 42P, 43P, 44P, 45P, and 46P may have a second width W2. The second width W2 may be greater than the first width W1. In some implementations, the second width W2 may be greater than the first width W1, and smaller than 2 times the first width W1. Spacing among the lower lines 41, 42, 43, 44, 45, and 46 may be substantially the same as the first width W1. That is, two adjacent lower lines among the lower lines 41, 42, 43, 44, 45, and 46 are distanced by the first width W1.

Spacing between the second pad 42P and the third pad 43P may be a third width W3. Spacing between the first pad 41P and the fourth pad 44P may be substantially the same as the spacing between the second pad 42P and the third pad 43P. The third width W3 may be greater than the spacing, i.e., the first width W1, between the second lower line 42 and the third lower line 43. In some implementations, the third width W3 may be greater than the first width W1, and smaller than 3 times the first width W1.

In accordance with the implementation of the present disclosure, the alignment clearance of the first lower plugs 31 and the plurality of pads 41P, 42P, 43P, 44P, 45P, and 46P can be significantly improved. The patterning process for forming the plurality of insulation patterns 51, 52, 53, and 54 and the plurality of upper plugs 57 can be simplified. The aspect ratio of each of the plurality of upper plugs 57 can be lowered. The process for forming the plurality of upper plugs 57 can be less difficult.

Referring to FIGS. 1 and 4, the plurality of upper plugs 57 may have a greater height than the plurality of insulation patterns 51, 52, 53, and 54. The upper ends of the plurality of insulation patterns 51, 52, 53, and 54 may be below the upper ends of the plurality of upper plugs 57 and the upper ends of the plurality of variable resistance elements 75. The upper ends of the plurality of upper plugs 57 and the upper ends of the plurality of variable resistance elements 75 may be aligned on substantially the same plane as one another.

Figure 5:
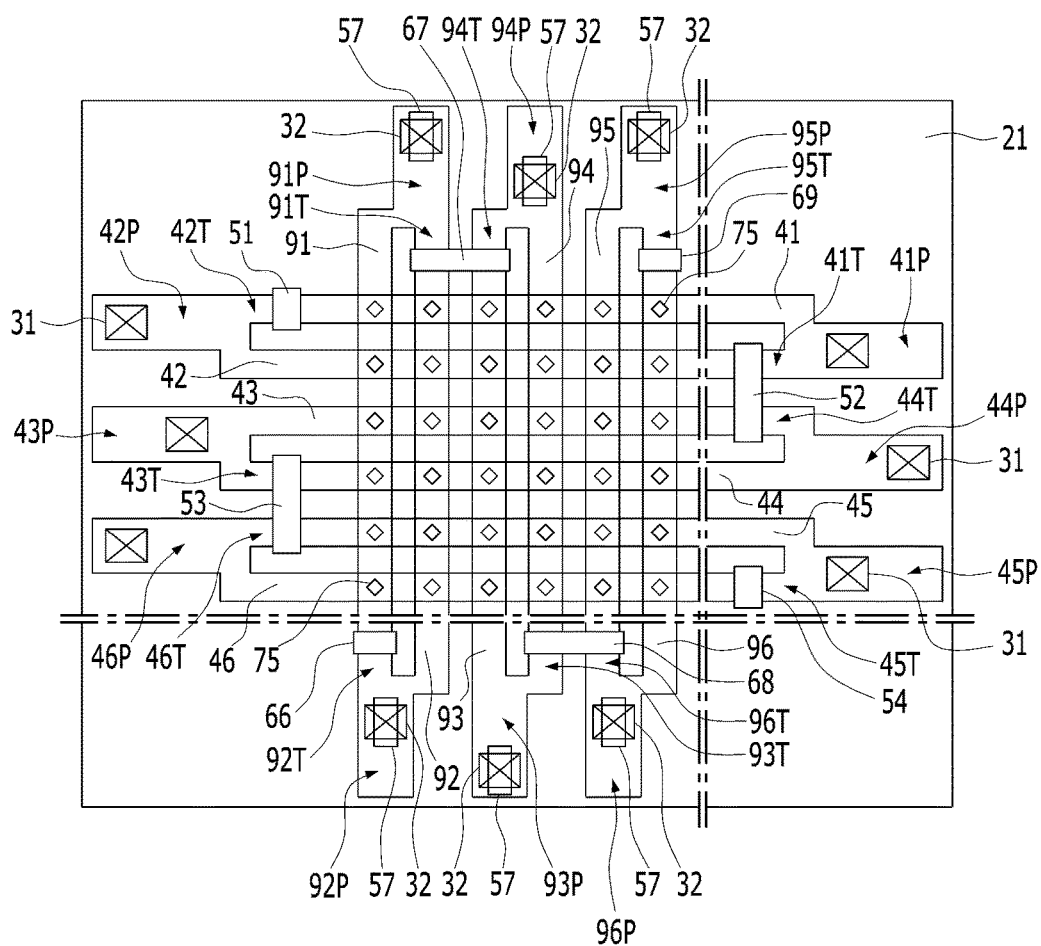
FIG. 5 is a layout view illustrating a method for fabricating a semiconductor device including variable resistance elements in accordance with an implementation of the present disclosure.

FIG. 5 is a layout view illustrating a method for fabricating a semiconductor device including a variable resistance element in accordance with an implementation of the present disclosure.

Referring to FIG. 5, a plurality of lower plugs 31 and 32, a plurality of lower lines 41, 42, 43, 44, 45, and 46, a plurality of pads 41P, 42P, 43P, 44P, 45P, and 46P, a plurality of projection parts 41T, 42T, 43T, 44T, 45T, and 46T, a plurality of insulation patterns 51, 52, 53, and 54, a plurality of upper plugs 57, a plurality of variable resistance elements 75, a plurality of upper insulation patterns 66, 67, 68, and 69, a plurality of upper lines 91, 92, 93, 94, 95, and 96, a plurality of upper pads 91P, 92P, 93P, 94P, 95P, and 96P, and a plurality of upper projection parts 91T, 92T, 93T, 94T, 95T, and 96T may be formed over a substrate 21.

The plurality of upper lines 91, 92, 93, 94, 95, and 96, the plurality of upper pads 91P, 92P, 93P, 94P, 95P, and 96P, the plurality of upper projection parts 91T, 92T, 93T, 94T, 95T, and 96T, and the plurality of upper insulation patterns 66, 67, 68, and 69 may be formed in a similar way to the plurality of lower lines 41, 42, 43, 44, 45, and 46, the plurality of pads 41P, 42P, 43P, 44P, 45P, and 46P, the plurality of projection parts 41T, 42T, 43T, 44T, 45T, and 46T, and the plurality of insulation patterns 51, 52, 53, and 54 described above with reference to FIGS. 1 to 4.

FIGS. 6, 10, 14, 16, 20, and 22 are layout views illustrating a method for fabricating a semiconductor device including a variable resistance element in accordance with an implementation of the present disclosure. FIGS. 7 to 9, 11 to 13, 15, 17 to 19, 21, 23, and 24 are cross-sectional views taken along lines I-I' and II-II' of FIGS. 6, 10, 14, 16, 20, and 22, and illustrate the method for fabricating the semiconductor device including the variable resistance element in accordance with the implementation of the present disclosure.

Figure 6:
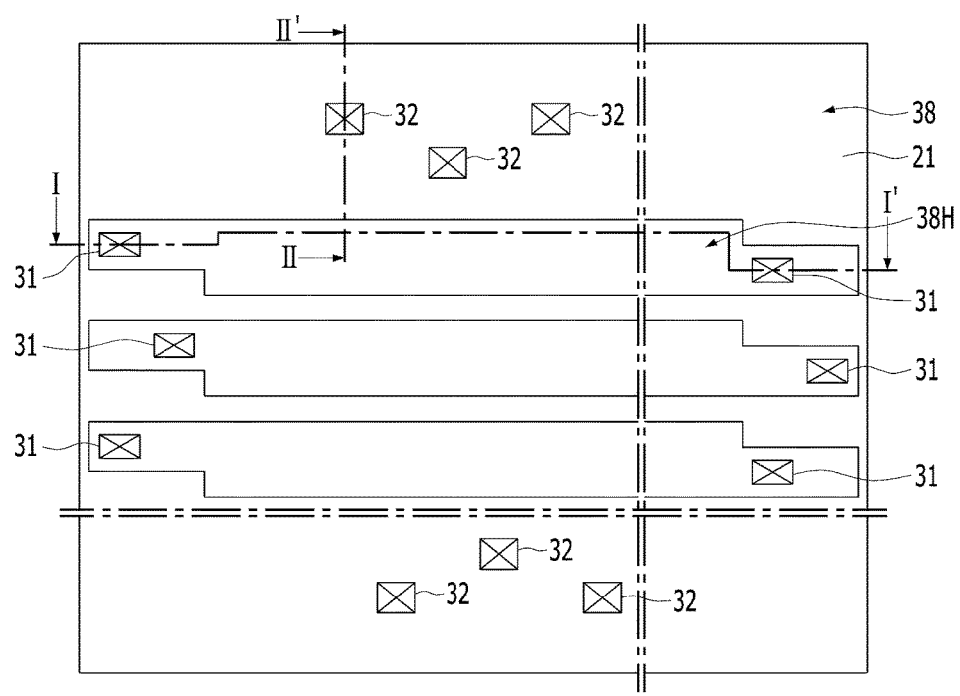
FIGS. 6, 10, 14, 16, 20, and 22 are layout views illustrating a method for fabricating a semiconductor device including variable resistance elements in accordance with an implementation of the present disclosure.
Figure 7:
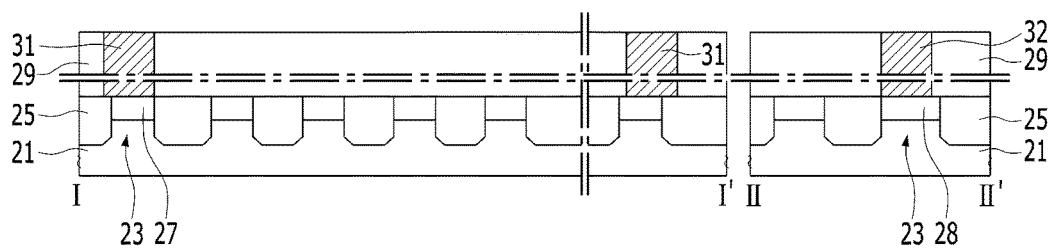
FIGS. 7 to 9, 11 to 13, 15, 17 to 19, 21, and 23 to 24 are cross-sectional views taken along lines I-I' and II-II' of FIGS. 6, 10, 14, 16, 20, and 22, respectively.

Referring to FIGS. 6 and 7, a device isolation layer 25 defining active regions 23 may be formed over a substrate 21. A plurality of switching elements 27 and 28 may be formed in the active regions 23. The switching elements 27 and 28 may include first switching elements 27 and second switching elements 28. A first interlayer dielectric layer 29 covering the switching elements 27 and 28 and the device isolation layer 25 may be formed. A plurality of lower plugs 31 and 32 passing through the first interlayer dielectric layer 29 and coupled to the switching elements 27 and 28 may be formed. The lower plugs 31 and 32 may include first lower plugs 31 formed over the first switching elements 27 and second lower plugs 32 formed over the second switching elements 28.

The substrate 21 may be a semiconductor substrate such as a silicon wafer or an SOI (silicon on insulator) wafer. The device isolation layer 25 may be formed by using STI (shallow trench isolation) technology. The device isolation layer 25 may include an insulating layer such as silicon oxide, silicon nitride, silicon oxynitride, or a combination thereof. The active regions 23 may be confined in the substrate 21 by the device isolation layer 25 and have patterns with various shapes and sizes. The switching elements 27 and 28 may be formed by implanting impurities into the active regions 23. For example, each of the switching elements 27 and 28 may correspond to a drain region or a source region of a transistor coupled to a word line or a bit line. The first interlayer dielectric layer 29 may include an insulating material such as silicon oxide, silicon nitride, silicon oxynitride, a low-K dielectric material, or a combination thereof.

In some implementations, the switching elements 27 and 28 may be formed in the first interlayer dielectric layer 29. Each of the switching elements 27 and 28 may include one or more of various elements including a recess channel array transistor (RCAT), a vertical transistor, a nanowire transistor, a finFET, a 3-dimensional transistor, a planar transistor, a thin film transistor, a diode, and so on.

The lower plugs 31 and 32 may include a conductive material such as a metal, a metal nitride, a metal oxide, a metal silicide, conductive carbon, polysilicon, or a combination thereof. For example, the lower plugs 31 and 32 may include W. The first lower plugs 31 may be coupled to the first switching elements 27, and the second lower plugs 32 may be coupled to the second switching elements 28. Each of the first lower plugs 31 may correspond to a word plug or a word line contact plug, and each of the second lower plugs 32 may include a bit plug or a bit line contact plug.

Forming the lower plugs 31 and 32 may include a thin film forming process and a planarization process. The planarization process may include a chemical mechanical polishing (CMP) process, an etch-back process, or a combination thereof. Upper surfaces of the lower plugs 31 and 32 and an upper surface of the first interlayer dielectric layer 29 may be disposed on substantially the same plane as each other. That is, the upper surfaces of the lower plugs 31 and 32 are level with the upper surface of the first interlayer dielectric layer 29.

Figure 8:
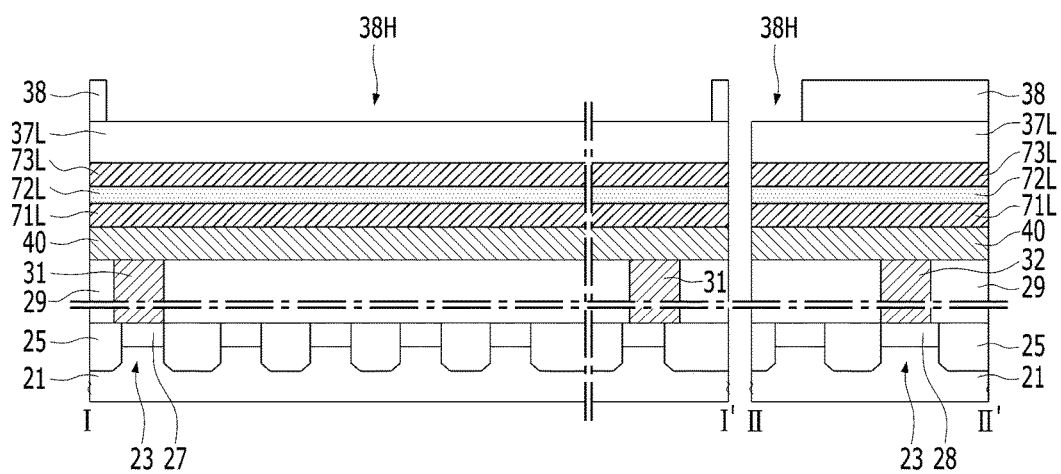

Referring to FIGS. 6 and 8, a lower line layer 40, a lower electrode layer 71L, a variable resistance layer 72L, an upper electrode layer 73L, and a hard mask layer 37L may be sequentially formed over the lower plugs 31 and 32 and the first interlayer dielectric layer 29. Subsequently, a first mask pattern 38 having a plurality of openings 38H may be formed over the hard mask layer 37L. The plurality of openings 38H may be disposed to overlap the first lower plugs 31.

The lower line layer 40 may be in direct contact with the first lower plugs 31 and the second lower plugs 32. The lower line layer 40 may include a conductive material such as a metal, a metal nitride, a metal oxide, a metal silicide, conductive carbon, or a combination thereof. For example, the lower line layer 40 may include W.

The lower electrode layer 71L may cover the lower line layer 40. The lower electrode layer 71L may include a conductive material such as a metal, a metal nitride, a metal oxide, a metal silicide, conductive carbon, or a combination thereof. The variable resistance layer 72L may cover the lower electrode layer 71L. The variable resistance layer 72L may include one or more of various materials, which are used in RRAM, PRAM, FRAM, MRAM, etc. The variable resistance layer 72L may include a transition metal oxide, a metal oxide such as a perovskite material, a phase change material such as a chalcogenide material, a ferroelectric material, a ferromagnetic material, or a combination thereof. The variable resistance layer 72L may have a single-layer structure or a multi-layer structure. The upper electrode layer 73L may cover the variable resistance layer 72L. The upper electrode layer 73L may include a conductive material such as a metal, a metal nitride, a metal oxide, a metal silicide, conductive carbon, or a combination thereof. The hard mask layer 37L may cover the upper electrode layer 73L. The first mask pattern 38 may include photoresist.

In FIG. 8, since the first mask pattern 38 is formed to have the plurality of openings 38H, some portions of the hard mask layer 37L are exposed by the openings 38H.

Figure 9:
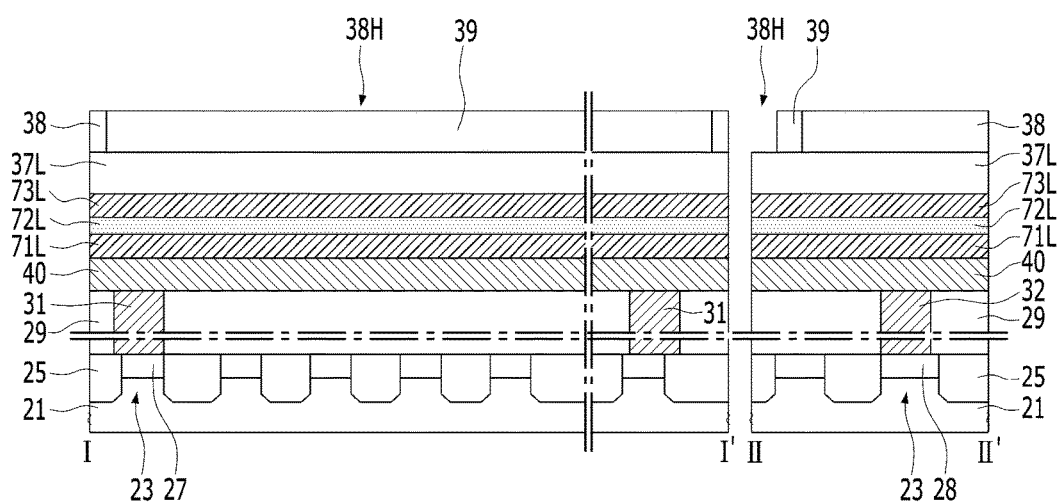

Referring to FIGS. 6 and 9, a sacrificial mask pattern 39 may be formed in the openings 38H. Forming the sacrificial mask pattern 39 may include a thin film forming process and an anisotropic etch process. The sacrificial mask pattern 39 may be formed on sidewalls of the first mask pattern 38 in the openings 38H. The sacrificial mask pattern 39 may include a material having an etch selectivity to the hard mask layer 37L. For example, the sacrificial mask pattern 39 may include a ULTO (ultra-low-temperature oxide).

Figure 10:
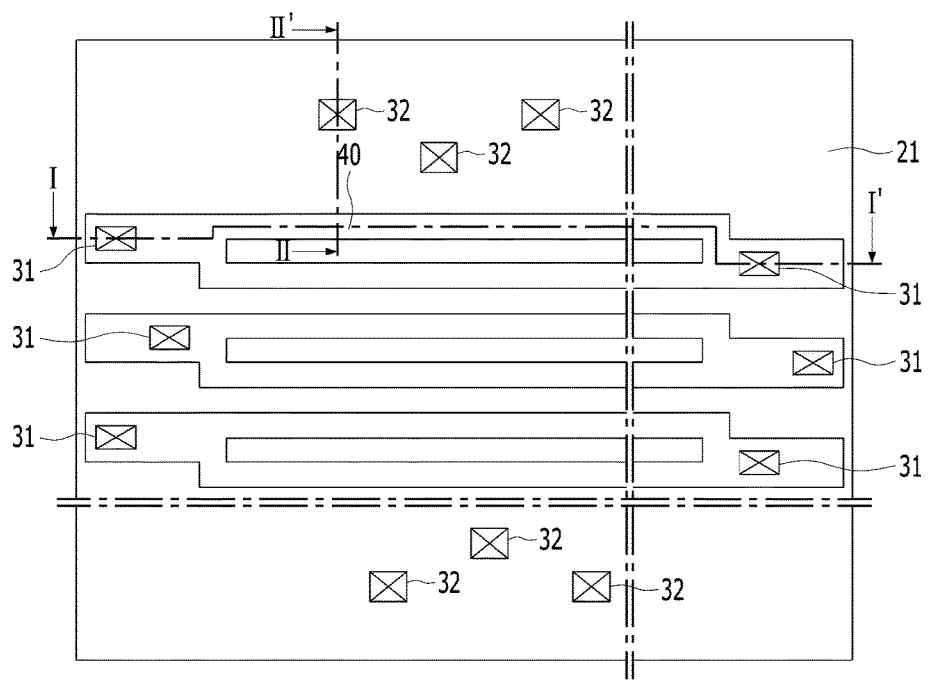
Figure 11:
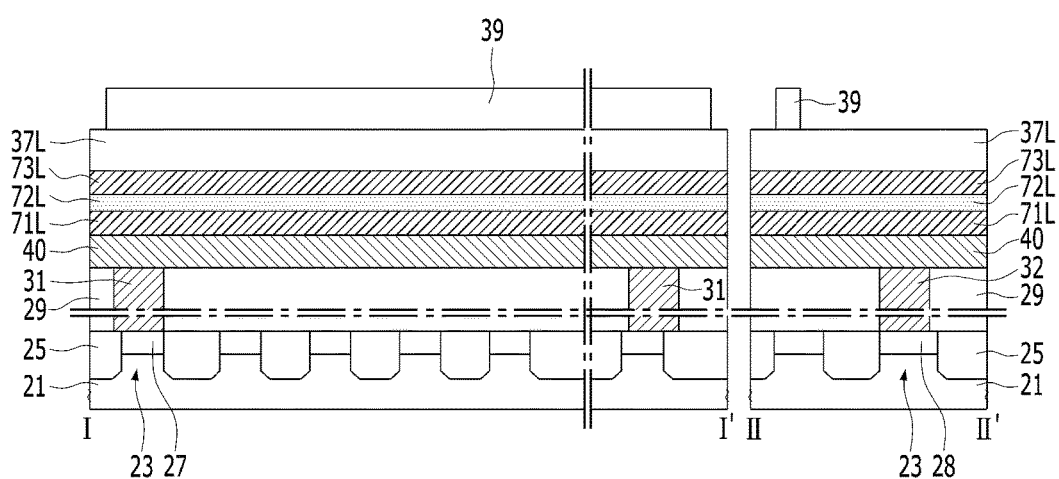

Referring to FIGS. 10 and 11, the first mask pattern 38 may be removed so that portions of the hard mask layer 37L, which are under the first mask pattern 38, may be exposed. The sacrificial mask pattern 39 may remain over the hard mask layer 37L to define a plurality of lower lines 41, 42, 43, 44, 45, and 46, which will be described later.

Figure 12:
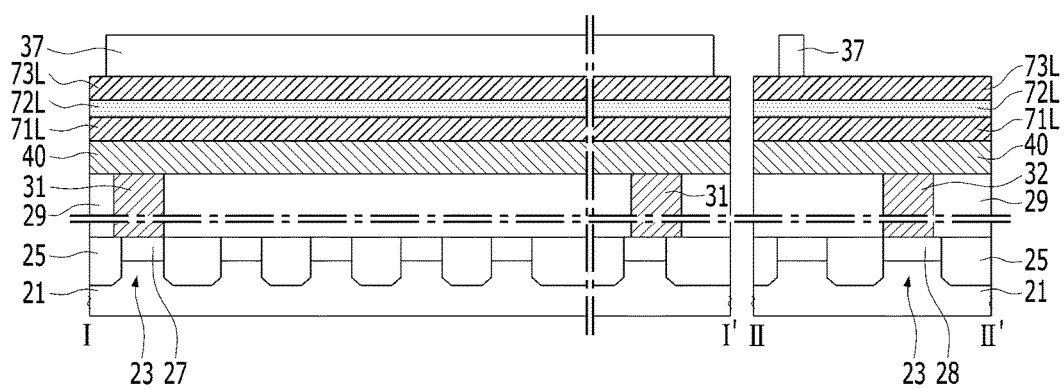

Referring to FIGS. 10 and 12, a hard mask pattern 37 may be formed by patterning the hard mask layer 37L by using the sacrificial mask pattern 39 as an etch mask. The sacrificial mask pattern 39 may be removed. The sacrificial mask pattern 39 may be transferred to the hard mask pattern 37. Thus, the hard mask pattern 37 defines the plurality of lower lines 41, 42, 43, 44, 45, and 46.

Figure 13:
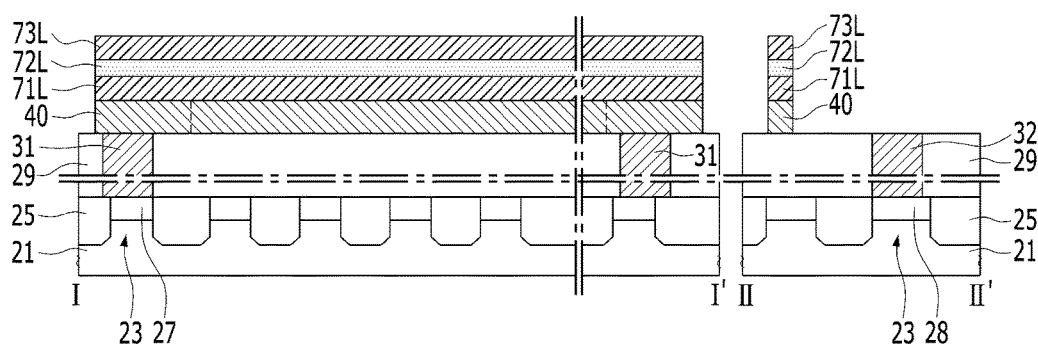

Referring to FIGS. 10 and 13, the upper electrode layer 73L, the variable resistance layer 72L, the lower electrode layer 71L, and the lower line layer 40 may be patterned using the hard mask pattern 37 as an etch mask, such that the first interlayer dielectric layer 29 and the second lower plugs 32 may be exposed. The patterning of the upper electrode layer 73L, the variable resistance layer 72L, the lower electrode layer 71L, and the lower line layer 40 may include an anisotropic etch process. The lower line layer 40 may be patterned to extend in a first direction and to cover the first lower plugs 31. The first direction is parallel to the line I-I'.

Figure 14:
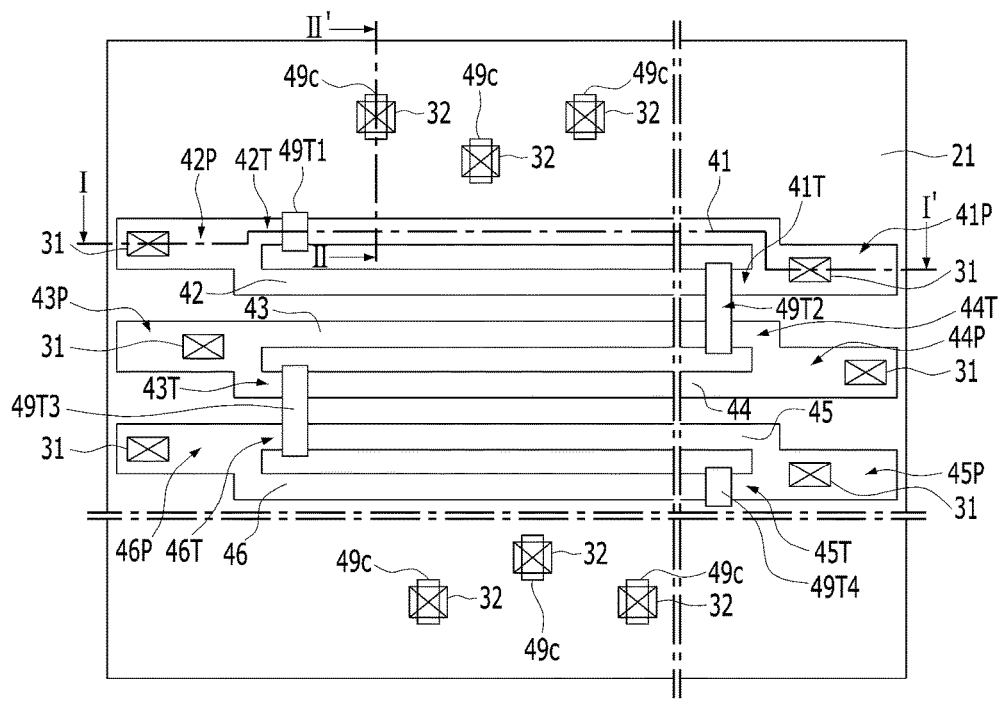
Figure 15:
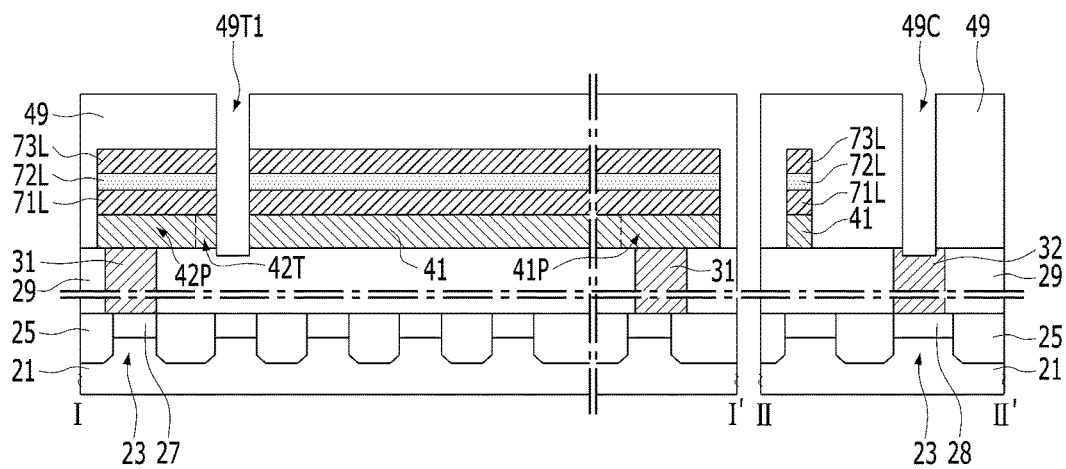

Referring to FIGS. 14 and 15, a second interlayer dielectric layer 49 may be formed to cover a resultant structure of FIG. 13. A plurality of trenches 49T1, 49T2, 49T3, and 49T4 may be formed to pass through the second interlayer dielectric layer 49, the upper electrode layer 73L, the variable resistance layer 72L, the lower electrode layer 71L, and the lower line layer 40 and to expose the first interlayer dielectric layer 29, and a plurality of contact holes 49C may be formed to pass through the second interlayer dielectric layer 49 and to expose the second lower plugs 32.

The forming of the trenches 49T1, 49T2, 49T3, and 49T4 and the contact holes 49C may include anisotropic etch processes, which are simultaneously performed. The lower line layer 40 patterned by the hard mask pattern 37 may be divided, by the trenches 49T1, 49T2, 49T3, and 49T4, into the first lower line 41, a first pad 41P, a first projection part 41T, the second lower line 42, a second pad 42P, a second projection part 42T, the third lower line 43, a third pad 43P, a third projection part 43T, the fourth lower line 44, a fourth pad 44P, a fourth projection part 44T, the fifth lower line 45, a fifth pad 45P, a fifth projection part 45T, the sixth lower line 46, a sixth pad 46P, and a sixth projection part 46T.

The second interlayer dielectric layer 49 may include silicon oxide, silicon nitride, silicon oxynitride, a low-K dielectric material, or a combination thereof. Bottoms of the trenches 49T1, 49T2, 49T3, and 49T4 may be disposed below a lower surface of the lower line layer 40. The bottoms of the trenches 49T1, 49T2, 49T3, and 49T4 may be disposed below an upper surface of the first interlayer dielectric layer 29. The first interlayer dielectric layer 29 may be exposed on the bottoms of the trenches 49T1, 49T2, 49T3, and 49T4.

Bottoms of the contact holes 49C may be disposed below a lower surface of the second interlayer dielectric layer 49. The bottoms of the contact holes 49C may be disposed below upper surfaces of the second lower plugs 32. The second lower plugs 32 may be exposed on the bottoms of the contact holes 49C. The trenches 49T1, 49T2, 49T3, and 49T4 may have substantially the same height as those of the contact holes 49C. The bottoms of the trenches 49T1, 49T2, 49T3, and 49T4 may be at substantially the same level as the bottoms of the contact holes 49C.

In accordance with the implementation of the present disclosure, the alignment clearance of the first lower plugs 31 and the plurality of pads 41P, 42P, 43P, 44P, 45P, and 46P can be significantly improved. The patterning for forming the trenches 49T1, 49T2, 49T3, and 49T4 and the contact holes 49C can include anisotropic etch processes, which are simultaneously performed. The patterning process for forming the trenches 49T1, 49T2, 49T3, and 49T4 and the contact holes 49C can be simplified. The aspect ratio of each of the contact holes 49C can be lowered. The process for forming the contact holes 49C can be less difficult.

Figure 16:
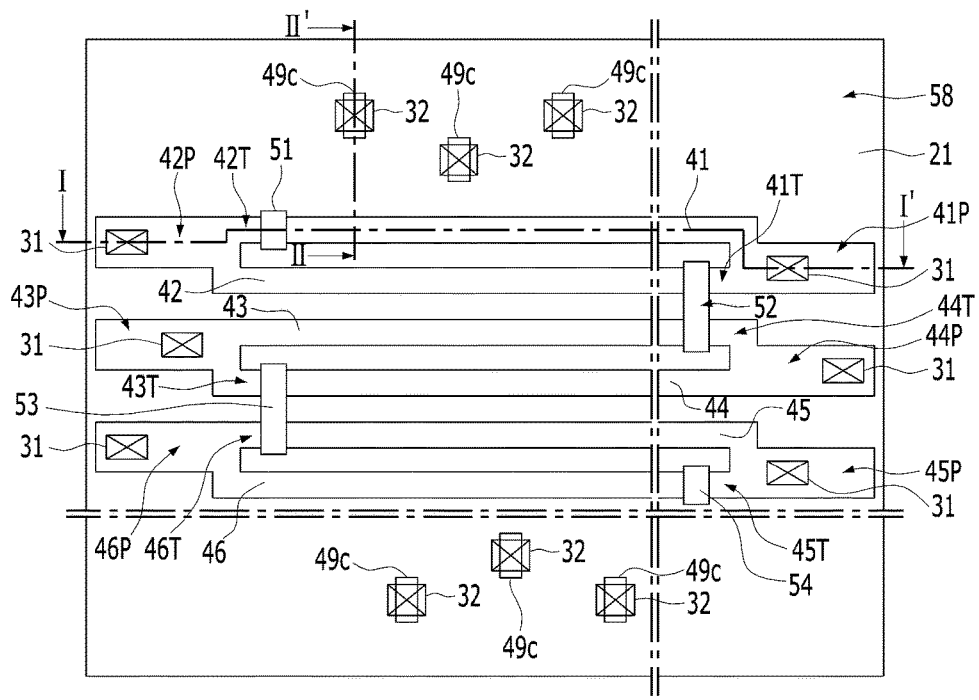
Figure 17:
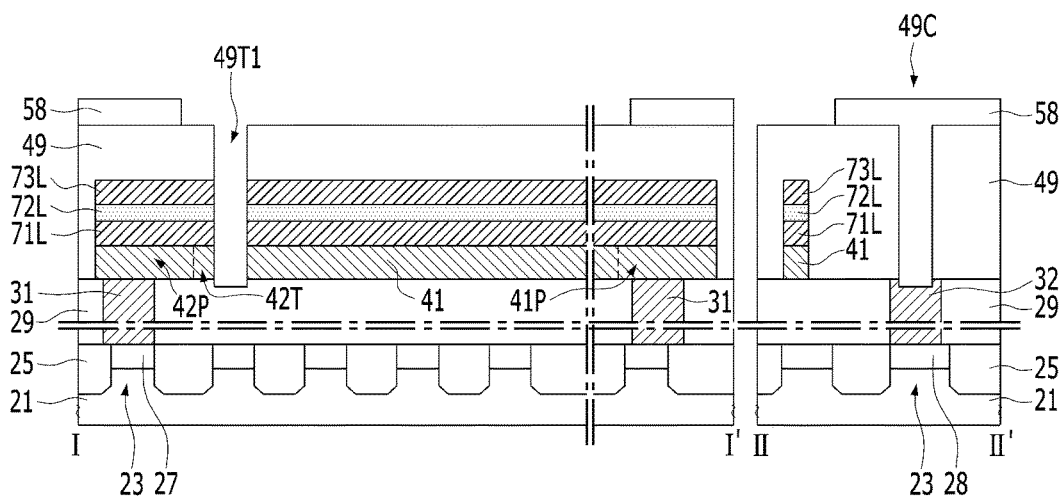

Referring to FIGS. 16 and 17, a second mask pattern 58 may be formed over the second interlayer dielectric layer 49. The second mask pattern 58 may expose the trenches 49T1, 49T2, 49T3, and 49T4, and cover the contact holes 49C. The second mask pattern 58 may include photoresist.

Figure 18:
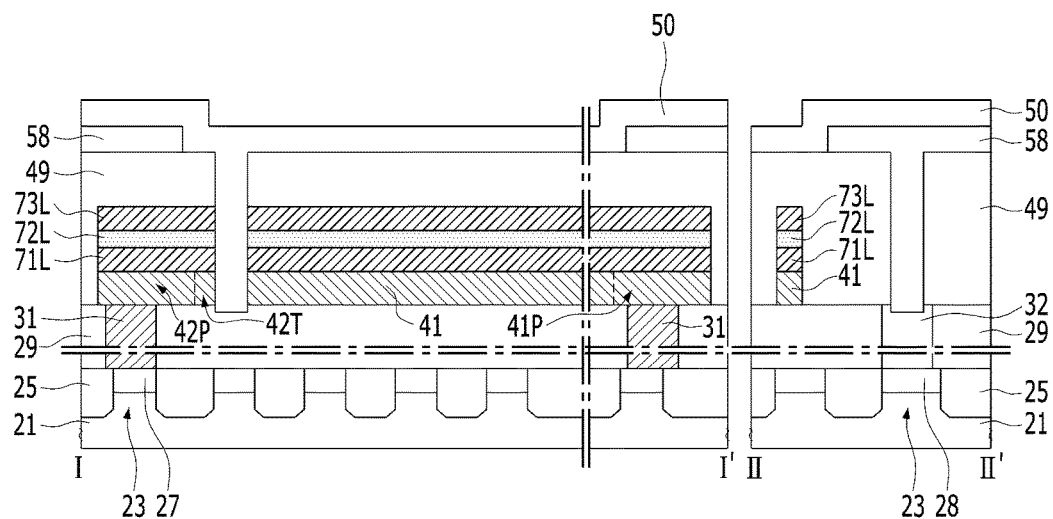

Referring to FIGS. 16 and 18, an insulating layer 50 may be formed over the second interlayer dielectric layer 49 and the second mask pattern 58. The insulating layer 50 may fill the trenches 49T1, 49T2, 49T3, and 49T4. The insulating layer 50 may include silicon oxide, silicon nitride, silicon oxynitride, a low-K dielectric material, or a combination thereof. For example, the insulating layer 50 may include a ULTO (ultra-low-temperature oxide).

Figure 19:
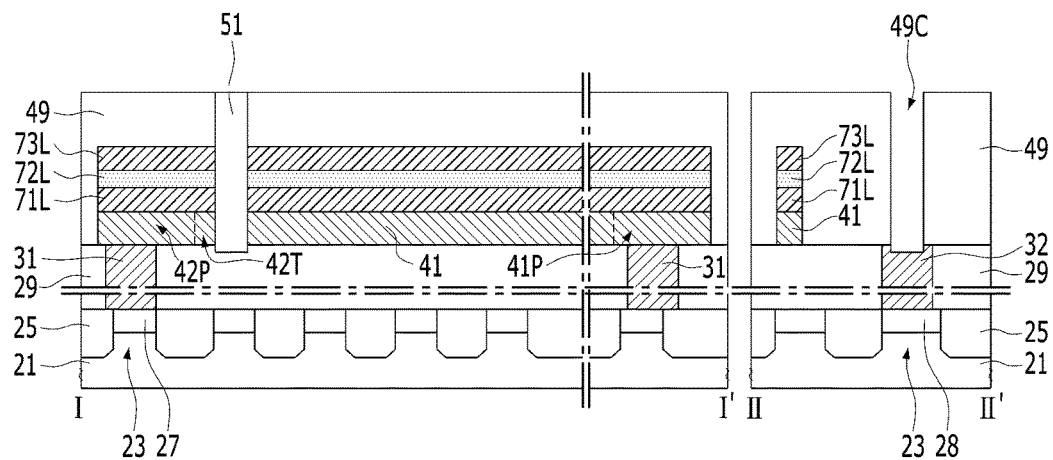

Referring to FIGS. 16 and 19, the insulating layer 50 may be planarized to form insulation patterns 51, 52, 53, and 54 that fill the trenches 49T1, 49T2, 49T3, and 49T4, respectively. The contact holes 49C may be exposed by removing the second mask pattern 58. The planarization process of the insulating layer 50 may include a chemical mechanical polishing (CMP) process, an etch-back process, or a combination thereof.

Figure 20:
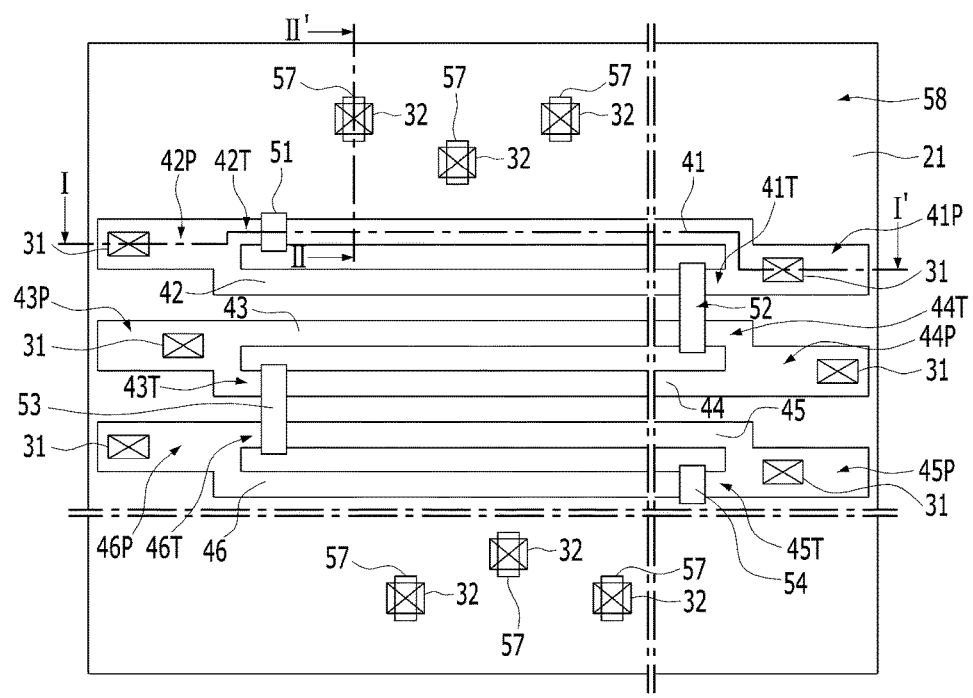
Figure 21:
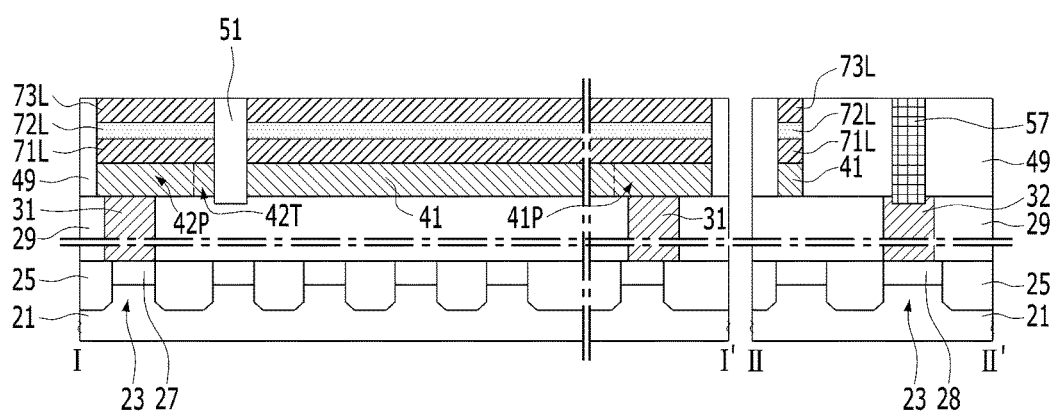

Referring to FIGS. 20 and 21, upper plugs 57 may be formed in the contact holes 49C. The upper plugs 57 may include a conductive material such as a metal, a metal nitride, a metal oxide, a metal silicide, conductive carbon, or a combination thereof. For example, the upper plugs 57 may include W. The upper plugs 57 may be formed by sequentially performing a thin film forming process and a planarization process. The planarization process may include a chemical mechanical polishing (CMP) process, an etch-back process, or a combination thereof. Upper ends of the upper plugs 57, upper ends of the insulation patterns 51, 52, 53, and 54, an upper surface of the upper electrode layer 73L, and an upper surface of the second interlayer dielectric layer 49 may be exposed on substantially the same plane as one another.

Figure 22:
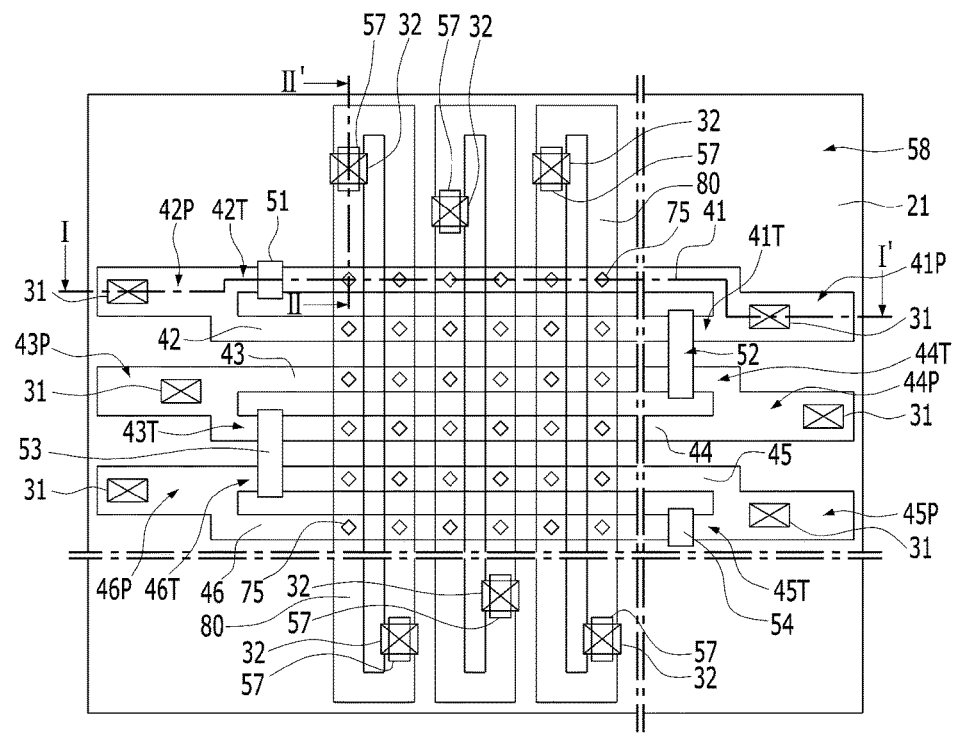
Figure 23:
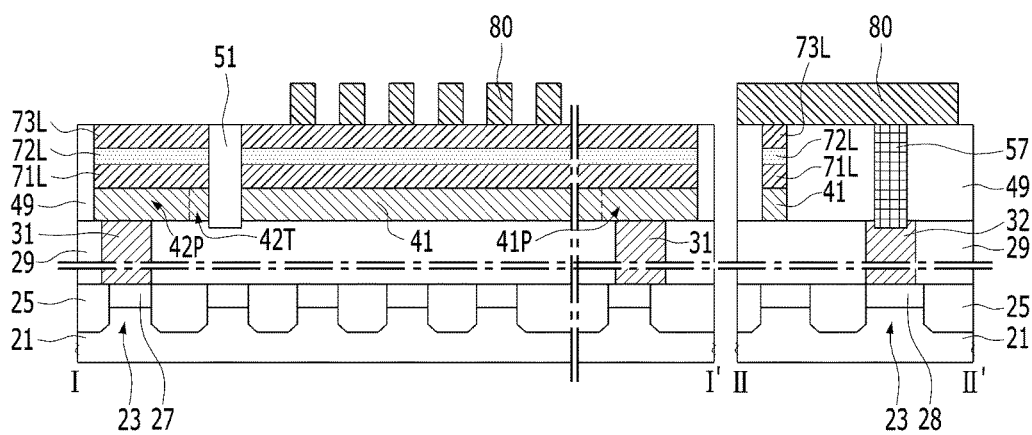

Referring to FIGS. 22 and 23, an upper line pattern 80 may be formed over the upper plugs 57, the upper electrode layer 73L, and the second interlayer dielectric layer 49. The upper line pattern 80 may cross the plurality of lower lines 41, 42, 43, 44, 45, and 46. A longitudinal length of the upper line pattern 80 extends in a second direction. The second direction crosses the first direction and is parallel to the line II-II'. The upper line pattern 80 may be in direct contact with the upper plugs 57 and the upper electrode layer 73L. The upper line pattern 80 may include a conductive material such as a metal, a metal nitride, a metal oxide, a metal silicide, conductive carbon, or a combination thereof. For example, the upper line pattern 80 may include W.

Figure 24:
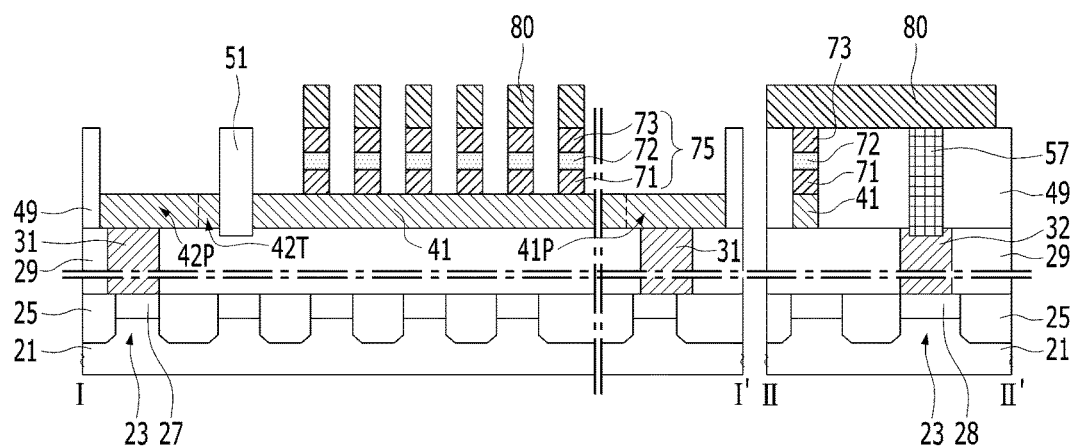

Referring to FIGS. 22 and 24, lower electrodes 71, variable resistance patterns 72, and upper electrodes 73 may be formed by patterning the upper electrode layer 73L, the variable resistance layer 72L, and the lower electrode layer 71L using the upper line pattern 80 as an etch mask. The lower electrodes 71, the variable resistance patterns 72, and the upper electrodes 73 may form variable resistance elements 75.

Referring back to FIGS. 1 and 3, a third interlayer dielectric layer 79 may be formed to cover a resultant structure of FIG. 24. After that, upper insulation patterns 89 passing through the upper line pattern 80 may be formed. The upper insulation patterns 89 extend in the first direction. Thus, the upper line pattern 80 may be divided, by the upper insulation patterns 89, into a first upper line 81, a second upper line 82, a third upper line 83, a fourth upper line 84, a fifth upper line 85, and a sixth upper line 86, which extend in the second direction and are spaced apart from each other in the first direction. The third interlayer dielectric layer 79 may include silicon oxide, silicon nitride, silicon oxynitride, a low-K dielectric material, or a combination thereof. The upper insulation patterns 89 may include silicon oxide, silicon nitride, silicon oxynitride, a low-K dielectric material, or a combination thereof.

The above and other memory circuits or semiconductor devices based on the disclosed technology can be used in a range of devices or systems. FIGS. 25 to 29 provide some examples of devices or systems that can implement the memory circuits disclosed herein.

Figure 25:
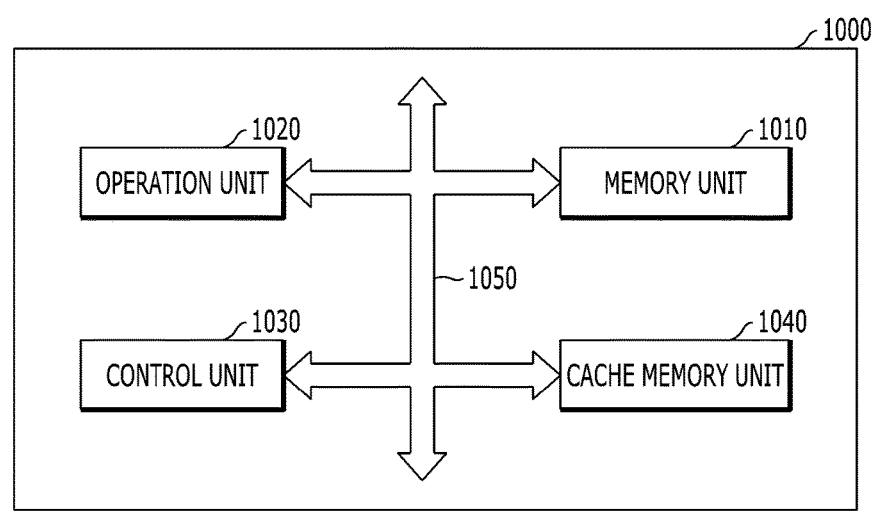
FIG. 25 is an example of a configuration diagram of a microprocessor implementing memory circuitry based on an implementation of the disclosed technology.

FIG. 25 is an example of configuration diagram of a microprocessor implementing memory circuitry based on the disclosed technology.

Referring to FIG. 25, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include first and second lower plugs disposed over a substrate; a first pad disposed over the first lower plug; a second pad being spaced apart from the first pad in the first direction; a first lower line extending from the first pad, being disposed between the first pad and the second pad in the first direction, and having a smaller width than the first pad in a second direction crossing the first direction; a second lower line extending from the second pad, being disposed between the first pad and the second pad in the first direction, being spaced apart from the first lower line in the second direction, and having a smaller width than the second pad in the second direction; a first insulation pattern disposed between the first lower line and the second pad, the first insulation pattern being in contact with an end of the first lower line; a second insulation pattern disposed between the second lower line and the first pad, the second insulation pattern being in contact with an end of the second lower line; an upper plug disposed over the second lower plug; an upper line traversing first lower line and the second lower line, being coupled to the upper plug, and extending in the second direction; and a plurality of variable resistance elements disposed at regions where the first and second lower lines overlap the upper line. Through this, data storage characteristics of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to this implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 26:
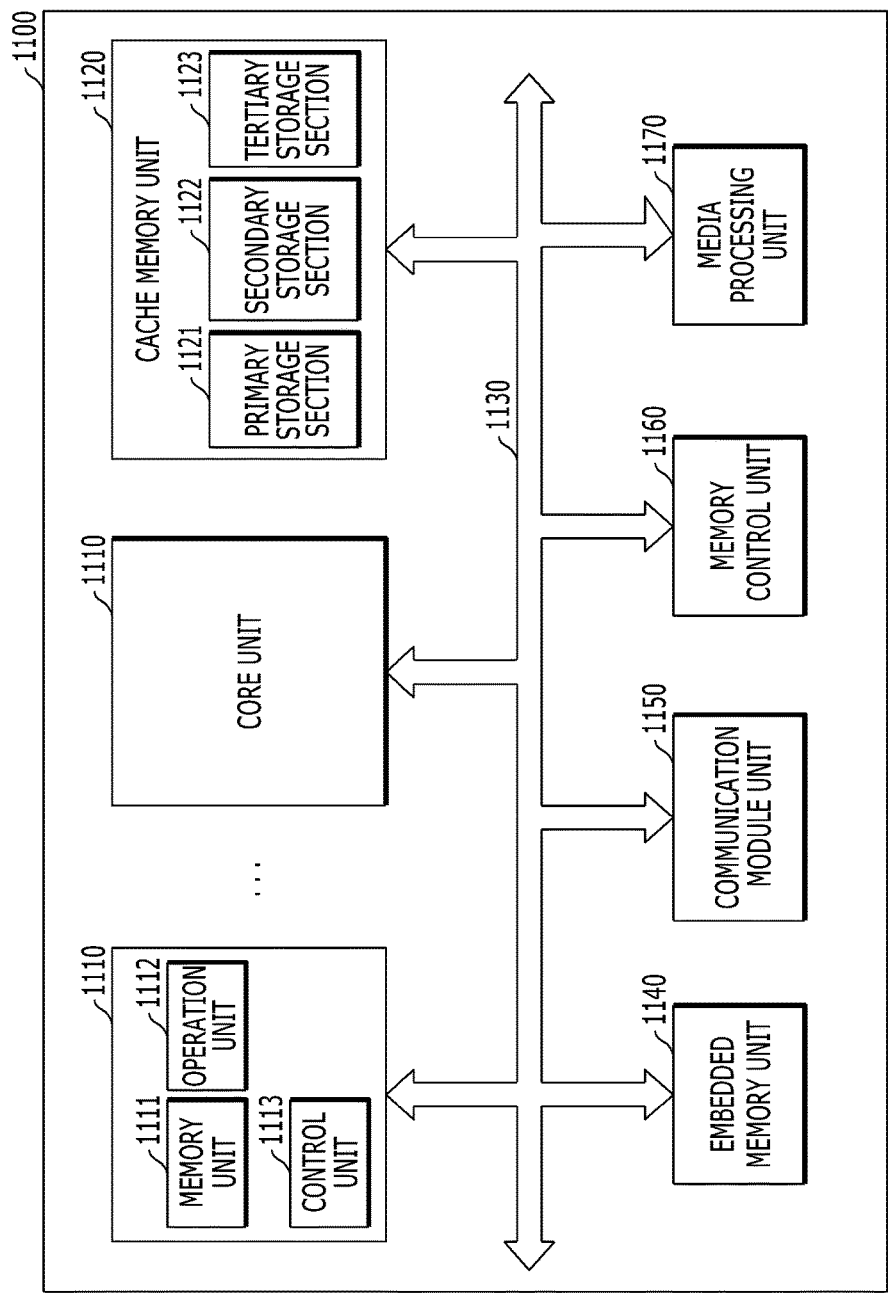
FIG. 26 is an example of a configuration diagram of a processor implementing memory circuitry based on an implementation of the disclosed technology.

FIG. 26 is an example of configuration diagram of a processor implementing memory circuitry based on the disclosed technology.

Referring to FIG. 26, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of this implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include first and second lower plugs disposed over a substrate; a first pad disposed over the first lower plug; a second pad being spaced apart from the first pad in the first direction; a first lower line extending from the first pad, being disposed between the first pad and the second pad in the first direction, and having a smaller width than the first pad in a second direction crossing the first direction; a second lower line extending from the second pad, being disposed between the first pad and the second pad in the first direction, being spaced apart from the first lower line in the second direction, and having a smaller width than the second pad in the second direction; a first insulation pattern disposed between the first lower line and the second pad, the first insulation pattern being in contact with an end of the first lower line; a second insulation pattern disposed between the second lower line and the first pad, the second insulation pattern being in contact with an end of the second lower line; an upper plug disposed over the second lower plug; an upper line traversing first lower line and the second lower line, being coupled to the upper plug, and extending in the second direction; and a plurality of variable resistance elements disposed at regions where the first and second lower lines overlap the upper line. Through this, data storage characteristics of the cache memory unit 1120 may be improved. As a consequence, operating characteristics of the processor 1100 may be improved.

Although it was shown in FIG. 26 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to this implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to this implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 27:
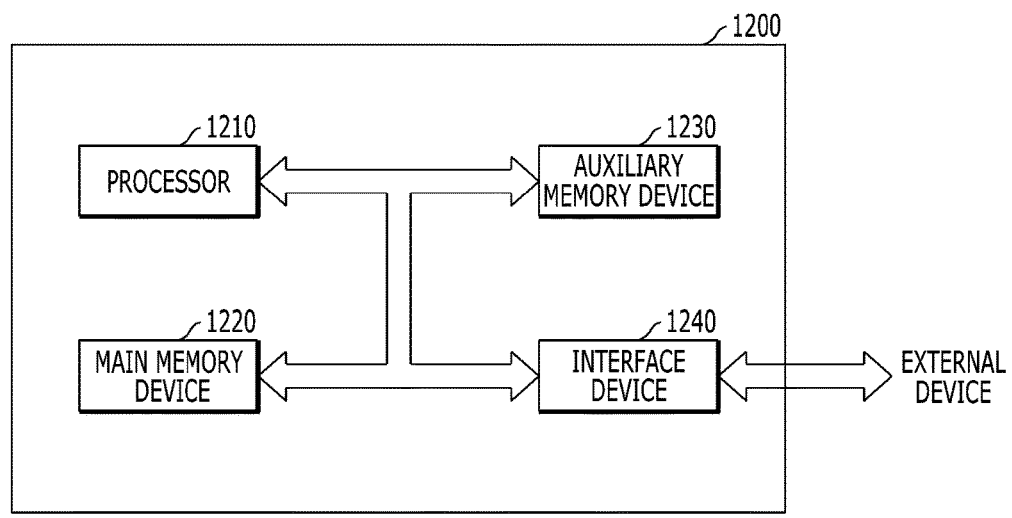
FIG. 27 is an example of a configuration diagram of a system implementing memory circuitry based on an implementation of the disclosed technology.

FIG. 27 is an example of configuration diagram of a system implementing memory circuitry based on the disclosed technology.

Referring to FIG. 27, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of this implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include first and second lower plugs disposed over a substrate; a first pad disposed over the first lower plug; a second pad being spaced apart from the first pad in the first direction; a first lower line extending from the first pad, being disposed between the first pad and the second pad in the first direction, and having a smaller width than the first pad in a second direction crossing the first direction; a second lower line extending from the second pad, being disposed between the first pad and the second pad in the first direction, being spaced apart from the first lower line in the second direction, and having a smaller width than the second pad in the second direction; a first insulation pattern disposed between the first lower line and the second pad, the first insulation pattern being in contact with an end of the first lower line; a second insulation pattern disposed between the second lower line and the first pad, the second insulation pattern being in contact with an end of the second lower line; an upper plug disposed over the second lower plug; an upper line traversing first lower line and the second lower line, being coupled to the upper plug, and extending in the second direction; and a plurality of variable resistance elements disposed at regions where the first and second lower lines overlap the upper line. Through this, data storage characteristics of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include first and second lower plugs disposed over a substrate; a first pad disposed over the first lower plug; a second pad being spaced apart from the first pad in the first direction; a first lower line extending from the first pad, being disposed between the first pad and the second pad in the first direction, and having a smaller width than the first pad in a second direction crossing the first direction; a second lower line extending from the second pad, being disposed between the first pad and the second pad in the first direction, being spaced apart from the first lower line in the second direction, and having a smaller width than the second pad in the second direction; a first insulation pattern disposed between the first lower line and the second pad, the first insulation pattern being in contact with an end of the first lower line; a second insulation pattern disposed between the second lower line and the first pad, the second insulation pattern being in contact with an end of the second lower line; an upper plug disposed over the second lower plug; an upper line traversing first lower line and the second lower line, being coupled to the upper plug, and extending in the second direction; and a plurality of variable resistance elements disposed at regions where the first and second lower lines overlap the upper line. Through this, data storage characteristics of the auxiliary memory device 1230 may be improved. As a consequence, operating characteristics of the system 1200 may be improved.

Also, the auxiliary memory device 1230 may further include a data storage system (see the reference numeral 1300 of FIG. 28) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 27) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of this implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 28:
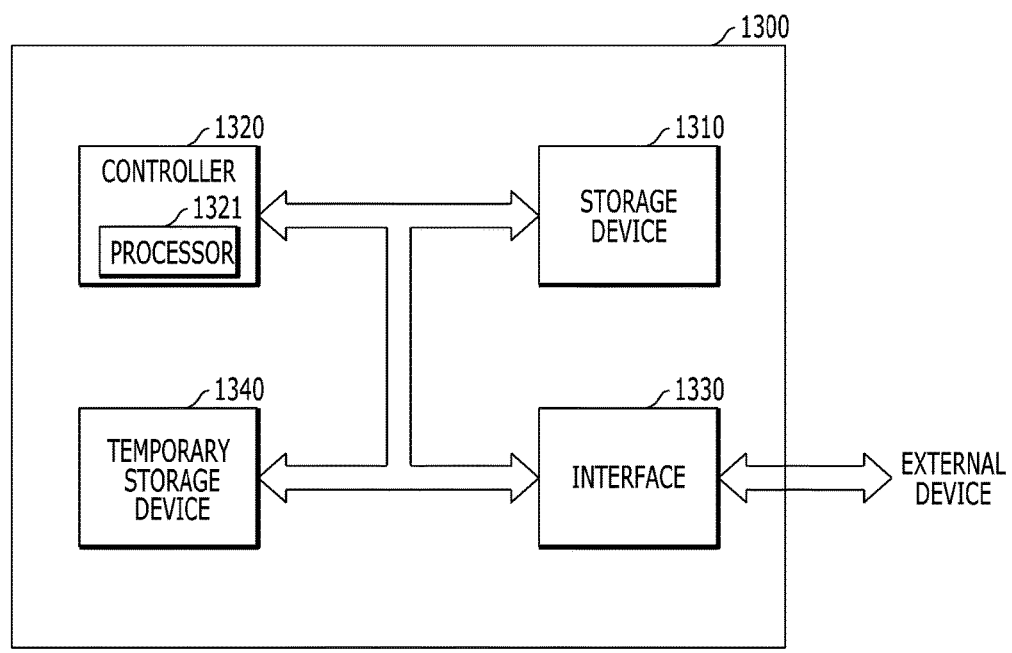
FIG. 28 is an example of a configuration diagram of a data storage system implementing memory circuitry based on an implementation of the disclosed technology.

FIG. 28 is an example of configuration diagram of a data storage system implementing memory circuitry based on the disclosed technology.

Referring to FIG. 28, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include first and second lower plugs disposed over a substrate; a first pad disposed over the first lower plug; a second pad being spaced apart from the first pad in the first direction; a first lower line extending from the first pad, being disposed between the first pad and the second pad in the first direction, and having a smaller width than the first pad in a second direction crossing the first direction; a second lower line extending from the second pad, being disposed between the first pad and the second pad in the first direction, being spaced apart from the first lower line in the second direction, and having a smaller width than the second pad in the second direction; a first insulation pattern disposed between the first lower line and the second pad, the first insulation pattern being in contact with an end of the first lower line; a second insulation pattern disposed between the second lower line and the first pad, the second insulation pattern being in contact with an end of the second lower line; an upper plug disposed over the second lower plug; an upper line traversing first lower line and the second lower line, being coupled to the upper plug, and extending in the second direction; and a plurality of variable resistance elements disposed at regions where the first and second lower lines overlap the upper line. Through this, data storage characteristics of the storage device 1310 or the temporary storage device 1340 may be improved. As a consequence, operating characteristics and data storage characteristics of the data storage system 1300 may be improved.

Figure 29:
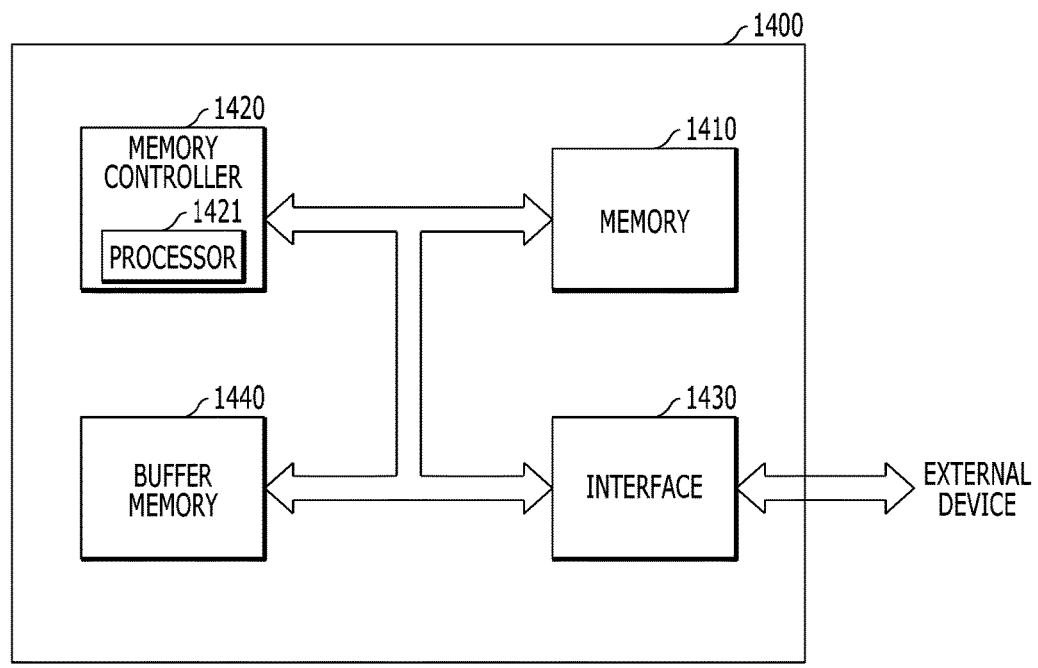
FIG. 29 is an example of a configuration diagram of a memory system implementing memory circuitry based on an implementation of the disclosed technology.

FIG. 29 is an example of configuration diagram of a memory system implementing memory circuitry based on the disclosed technology.

Referring to FIG. 29, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include first and second lower plugs disposed over a substrate; a first pad disposed over the first lower plug; a second pad being spaced apart from the first pad in the first direction; a first lower line extending from the first pad, being disposed between the first pad and the second pad in the first direction, and having a smaller width than the first pad in a second direction crossing the first direction; a second lower line extending from the second pad, being disposed between the first pad and the second pad in the first direction, being spaced apart from the first lower line in the second direction, and having a smaller width than the second pad in the second direction; a first insulation pattern disposed between the first lower line and the second pad, the first insulation pattern being in contact with an end of the first lower line; a second insulation pattern disposed between the second lower line and the first pad, the second insulation pattern being in contact with an end of the second lower line; an upper plug disposed over the second lower plug; an upper line traversing first lower line and the second lower line, being coupled to the upper plug, and extending in the second direction; and a plurality of variable resistance elements disposed at regions where the first and second lower lines overlap the upper line. Through this, data storage characteristics of the memory 1410 may be improved. As a consequence, operating characteristics and data storage characteristics of the memory system 1400 may be improved.

Also, the memory 1410 according to this implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to this implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include first and second lower plugs disposed over a substrate; a first pad disposed over the first lower plug; a second pad being spaced apart from the first pad in the first direction; a first lower line extending from the first pad, being disposed between the first pad and the second pad in the first direction, and having a smaller width than the first pad in a second direction crossing the first direction; a second lower line extending from the second pad, being disposed between the first pad and the second pad in the first direction, being spaced apart from the first lower line in the second direction, and having a smaller width than the second pad in the second direction; a first insulation pattern disposed between the first lower line and the second pad, the first insulation pattern being in contact with an end of the first lower line; a second insulation pattern disposed between the second lower line and the first pad, the second insulation pattern being in contact with an end of the second lower line; an upper plug disposed over the second lower plug; an upper line traversing first lower line and the second lower line, being coupled to the upper plug, and extending in the second direction; and a plurality of variable resistance elements disposed at regions where the first and second lower lines overlap the upper line. Through this, data storage characteristics of the buffer memory 1440 may be improved. As a consequence, operating characteristics and data storage characteristics of the memory system 1400 may be improved.

Moreover, the buffer memory 1440 according to this implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 25-29 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory, wherein the semiconductor memory comprises:
    first and second lower plugs disposed over a substrate;
    a first pad disposed over the first lower plug;
    a second pad being spaced apart from the first pad in the first direction;
    a first lower line extending from the first pad, being disposed between the first pad and the second pad in the first direction, and having a smaller width than the first pad in a second direction crossing the first direction;
    a second lower line extending from the second pad, being disposed between the first pad and the second pad in the first direction, being spaced apart from the first lower line in the second direction, and having a smaller width than the second pad in the second direction;
    a first insulation pattern disposed between the first lower line and the second pad, the first insulation pattern being in contact with an end of the first lower line;
    a second insulation pattern disposed between the second lower line and the first pad, the second insulation pattern being in contact with an end of the second lower line;
    an upper plug disposed over the second lower plug;
    an upper line traversing first lower line and the second lower line, being coupled to the upper plug, and extending in the second direction; and
    a plurality of variable resistance elements disposed at regions where the first and second lower lines overlap the upper line.

2. The electronic device of claim 1, wherein a lower end of the first insulation pattern, a lower end of the second insulation pattern, and a lower end of the upper plug are aligned on substantially the same plane as one another.

3. The electronic device of claim 1, wherein a lower end of the first insulation pattern, a lower end of the second insulation pattern, and a lower end of the upper plug are disposed below a lower surface of the first lower line, a lower surface of the first pad, and a lower surface of the second pad.

4. The electronic device of claim 1, wherein the first insulation pattern, the second insulation pattern, and the upper plug have substantially the same height as one another.

5. The electronic device of claim 1, wherein an upper end of the first insulation pattern, an upper end of the second insulation pattern, an upper end of the upper plug, and upper surfaces of the plurality of variable resistance elements are aligned on substantially the same plane as one another.

6. The electronic device of claim 1, wherein an upper end of the first insulation pattern and an upper end of the second insulation pattern are disposed below an upper end of the upper plug.

7. The electronic device of claim 1, wherein an upper end of the first lower plug and an upper end of the second lower plug are aligned on substantially the same plane as each other.

8. The electronic device of claim 1, wherein, in the second direction, the first lower line has a first width, the first pad has a second width, the second width being smaller than two times the first width.

9. The electronic device of claim 8, further comprising:
    a third pad adjacent to the second pad; and
    a third lower line extending from the third pad and being adjacent to the second lower line in the second direction,
    wherein the third pad is spaced apart from the second pad by a third width in the second direction, the third width being greater than the first width and smaller than three times the first width.

10. The electronic device of claim 1, further comprising:
    a first projection part, which extends from the first pad, is disposed between the first pad and the second insulation pattern, and has substantially the same width as the second lower line in the second direction; and
    a second projection part, which extends from the second pad, is disposed between the second pad and the first insulation pattern, and has substantially the same width as the first lower line in the second direction,
    wherein the first and second project parts are parallel to the first and second lower lines.

11. The electronic device of claim 10, wherein a side surface of the first lower line, a side surface of the second projection part, and a side surface of the second pad are aligned on substantially the same plane as one another along the first direction.

12. The electronic device of claim 10, wherein a first side surface of the first lower line, a first side surface of the second projection part, and a first side surface of the second pad are aligned on substantially the same plane as one another along the first direction,
- wherein a second side surface of the first lower line, a second side surface of the second projection part, and a first side surface of the first pad are aligned on substantially the same plane as one another along the first direction,
- wherein a first side surface of the second lower line, a first side surface of the first projection part, and a second side surface of the second pad are aligned on substantially the same plane as one another along the first direction, and
- wherein a second side surface of the second lower line, a second side surface of the first projection part, and a second side surface of the first pad are aligned on substantially the same plane as one another along the first direction.

13. The electronic device according to claim 1, further comprising a microprocessor which includes:
- a control unit configured to receive a signal including a command from an outside of the microprocessor, and performs extracting, decoding of the command, or controlling input or output of a signal of the microprocessor;
- an operation unit configured to perform an operation based on a result that the control unit decodes the command; and
- a memory unit configured to store data for performing the operation, data corresponding to a result of performing the operation, or an address of data for which the operation is performed,
- wherein the semiconductor memory is part of the memory unit in the microprocessor.

14. The electronic device according to claim 1, further comprising a processor which includes:
- a core unit configured to perform, based on a command inputted from an outside of the processor, an operation corresponding to the command, by using data;
- a cache memory unit configured to store data for performing the operation, data corresponding to a result of performing the operation, or an address of data for which the operation is performed; and
- a bus interface connected between the core unit and the cache memory unit, and configured to transmit data between the core unit and the cache memory unit,
- wherein the semiconductor memory is part of the cache memory unit in the processor.

15. The electronic device according to claim 1, further comprising a processing system which includes:
- a processor configured to decode a command received by the processor and control an operation for information based on a result of decoding the command;
- an auxiliary memory device configured to store a program for decoding the command and the information;
- a main memory device configured to call and store the program and the information from the auxiliary memory device such that the processor can perform the operation using the program and the information when executing the program; and
- an interface device configured to perform communication between at least one of the processor, the auxiliary memory device and the main memory device and the outside,
- wherein the semiconductor memory is part of the auxiliary memory device or the main memory device in the processing system.

16. The electronic device according to claim 1, further comprising a data storage system which includes:
- a storage device configured to store data and conserve stored data regardless of power supply;
- a controller configured to control input and output of data to and from the storage device according to a command inputted from an outside;
- a temporary storage device configured to temporarily store data exchanged between the storage device and the outside; and
- an interface configured to perform communication between at least one of the storage device, the controller and the temporary storage device and the outside,
- wherein the semiconductor memory is part of the storage device or the temporary storage device in the data storage system.

17. The electronic device according to claim 1, further comprising a memory system which includes:
- a memory configured to store data and conserve stored data regardless of power supply;
- a memory controller configured to control input and output of data to and from the memory according to a command inputted from an outside;
- a buffer memory configured to buffer data exchanged between the memory and the outside; and
- an interface configured to perform communication between at least one of the memory, the memory controller and the buffer memory and the outside,
- wherein the semiconductor memory is part of the memory or the buffer memory in the memory system.

* * * * *